(12) United States Patent
Liaw

(10) Patent No.: US 11,869,892 B2
(45) Date of Patent: Jan. 9, 2024

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventor: Jhon Jhy Liaw, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 192 days.

(21) Appl. No.: 17/475,665

(22) Filed: Sep. 15, 2021

(65) Prior Publication Data

US 2022/0352162 A1 Nov. 3, 2022

Related U.S. Application Data

(60) Provisional application No. 63/181,408, filed on Apr. 29, 2021.

(51) Int. Cl.
*H01L 27/092* (2006.01)
*H01L 29/417* (2006.01)
(Continued)

(52) U.S. Cl.
CPC .. *H01L 27/0924* (2013.01); *H01L 21/823418* (2013.01); *H01L 21/823431* (2013.01);
(Continued)

(58) Field of Classification Search
CPC ......... H01L 27/0924; H01L 21/823418; H01L 21/823431; H01L 21/823468; H01L 29/41791; H01L 29/6656; H01L 29/66795; H01L 29/7851; H01L 21/823821; H01L 21/823475; H01L 21/823814; H01L 21/823871; H01L 21/823412; H01L 21/823807; H01L 29/66545; H01L 27/0886; H01L 21/823878
See application file for complete search history.

(56) References Cited

U.S. PATENT DOCUMENTS 9,093,530 B2 7/2015 Huang et al.
9,171,929 B2 10/2015 Lee et al.
(Continued)

*Primary Examiner* — Karen Kusumakar
*Assistant Examiner* — Adam S Bowen
(74) *Attorney, Agent, or Firm* — NZ CARR LAW OFFICE

(57) ABSTRACT

A semiconductor device structure, along with methods of forming such, are described. The semiconductor device structure includes a first P-type metal oxide semiconductor field effect transistor (p-MOSFET) having a first fin extending along a first direction and comprising a first semiconductor layer, wherein the first fin comprises a first recess formed in a top of the first fin, the first recess having a bottom surface and a sidewall surface extending upwardly from the bottom surface. The semiconductor device structure also includes a first gate structure disposed in the first recess and in contact with the bottom surface and the sidewall surface, the first gate structure extending along a second direction substantially perpendicular to the first direction. The semiconductor device structure further includes a first spacer disposed on opposite sidewalls of the first gate structure and in contact with the first fin and the first gate structure.

20 Claims, 43 Drawing Sheets

(51) Int. Cl.
*H01L 29/66* (2006.01)
*H01L 21/8234* (2006.01)
*H01L 29/78* (2006.01)

(52) U.S. Cl.
CPC ........... *H01L 21/823468* (2013.01); *H01L 29/41791* (2013.01); *H01L 29/6656* (2013.01); *H01L 29/66795* (2013.01); *H01L 29/7851* (2013.01)

(56) References Cited

U.S. PATENT DOCUMENTS

| | | | |
|---|---|---|---|
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 2015/0263172 A1* | 9/2015 | Cho | H01L 29/66545 257/401 |

* cited by examiner

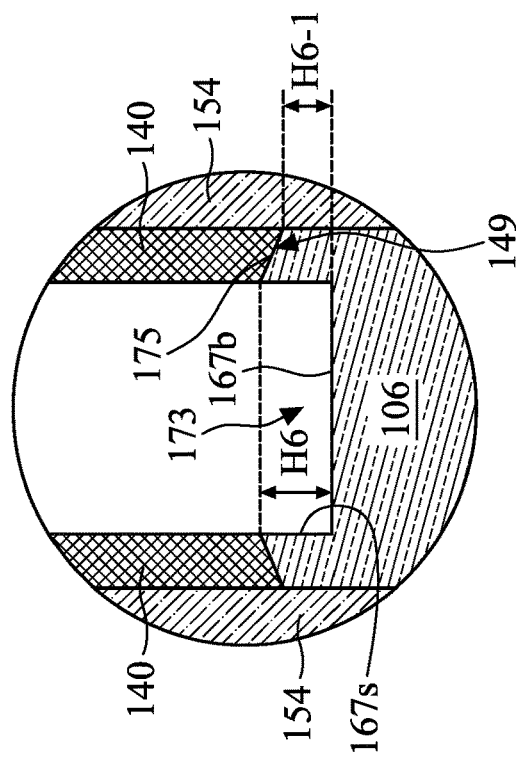
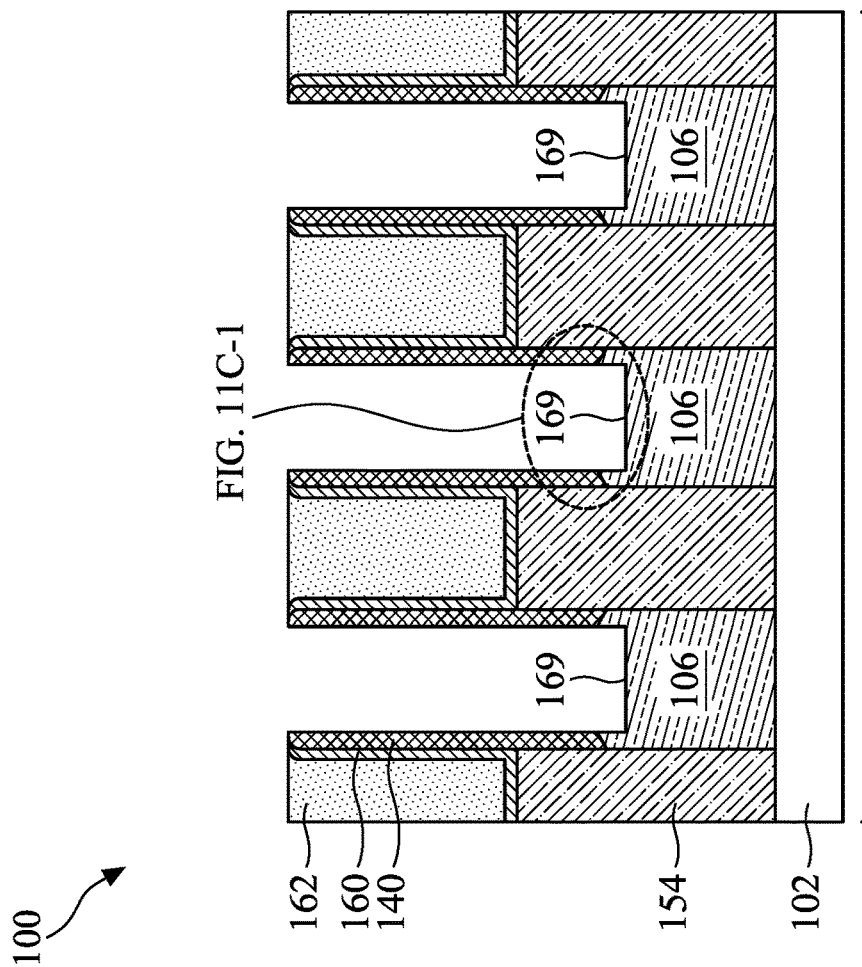
FIG. 11C-1
FIG. 11C

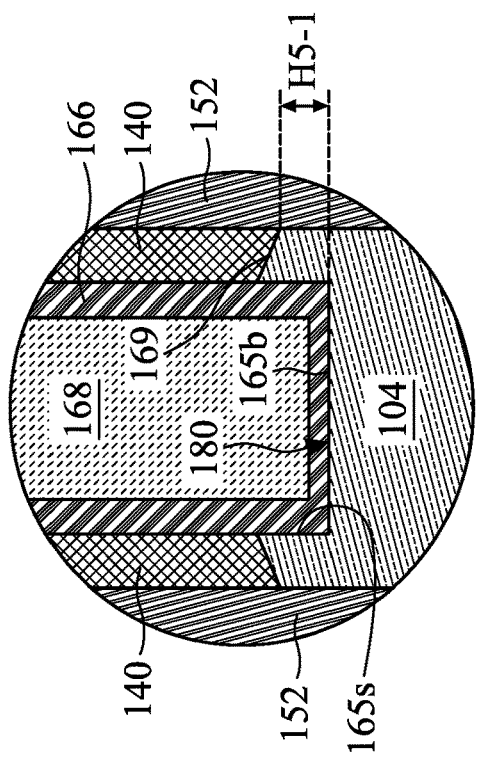
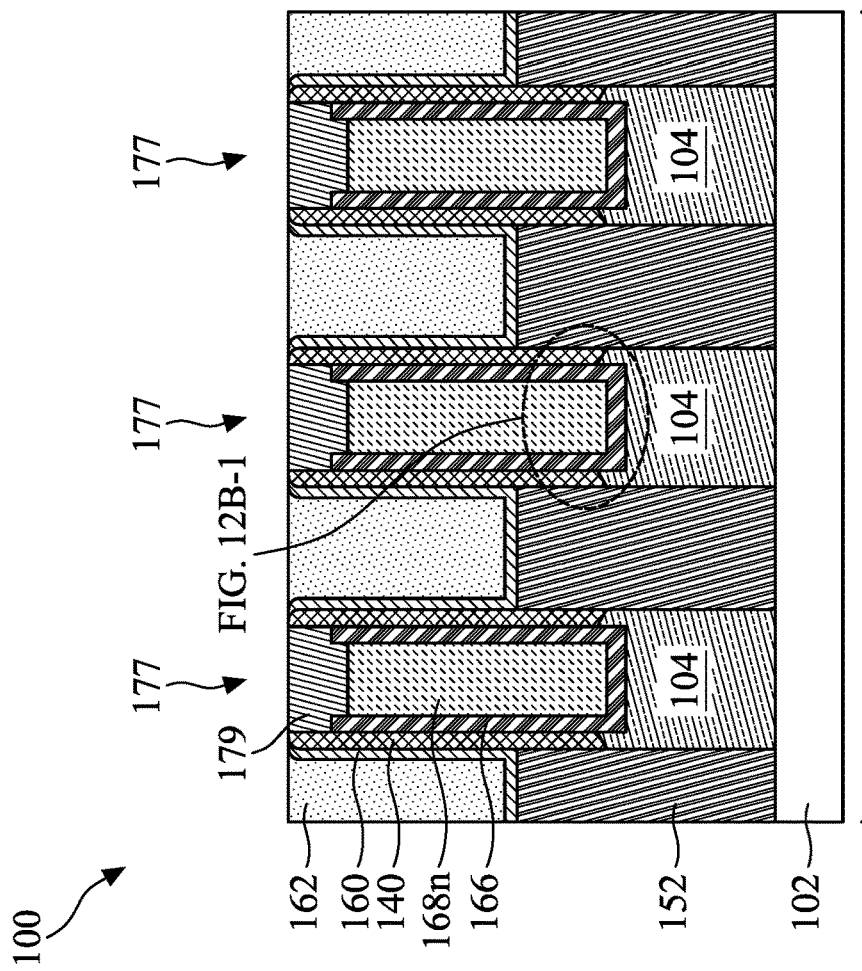
FIG. 12B-1
FIG. 12B

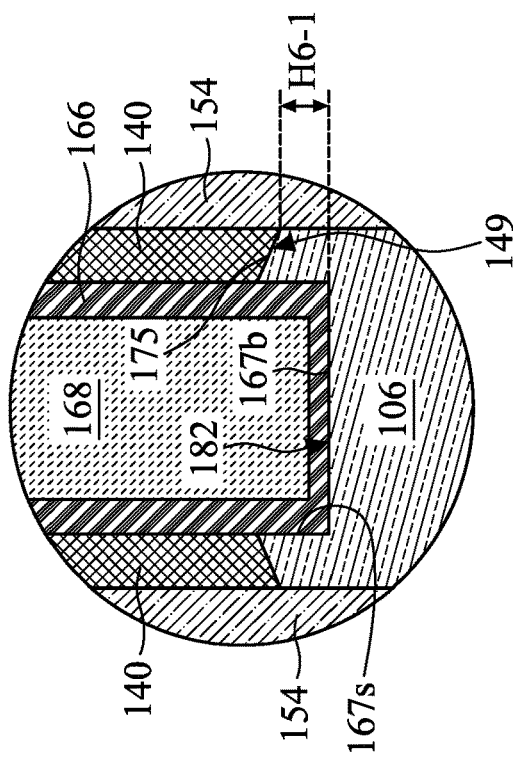
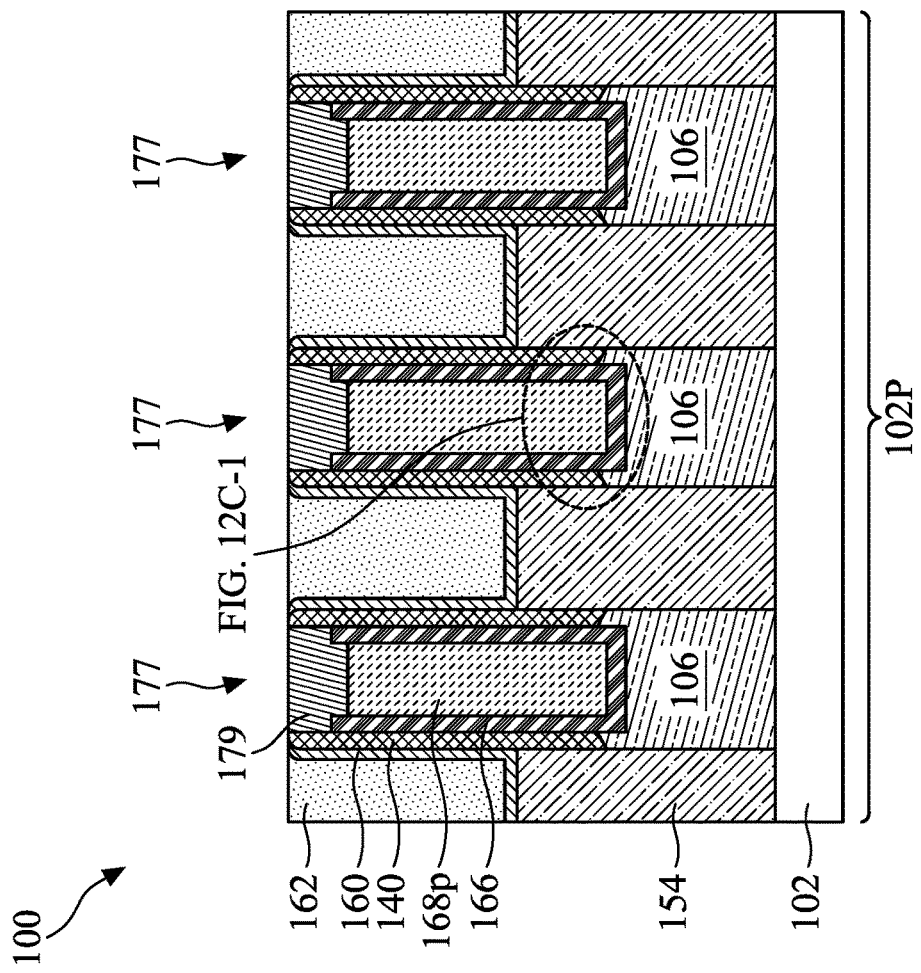
FIG. 12C-1
FIG. 12C

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

As the geometry size decreases, semiconductor devices, such as fin field-effect transistors (FinFETs), may be negatively impacted by the reduced distance between silicide regions and the respective junction borders, which results in current crowding at the substrate surface near edges of the source/drain regions. As a result, the drive current of the resulting transistor devices is adversely affected. Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-15A are cross-sectional side views of various stages of manufacturing the semiconductor device structure of FIG. 4 taken along line A-A, in accordance with some embodiments.

FIGS. 6B-15B are cross-sectional side views of various stages of manufacturing the semiconductor device structure of FIG. 4 taken along line B-B, in accordance with some embodiments.

FIGS. 6C-15C are cross-sectional side views of various stages of manufacturing the semiconductor device structure of FIG. 4 taken along line C-C, in accordance with some embodiments.

FIGS. 7B-1 to 7B-3 are enlarged views of a region of the semiconductor device structure of FIG. 7B, in accordance with some embodiments.

FIGS. 11B-1 is an enlarged view of a portion of the semiconductor device structure of FIG. 11C, in accordance with some embodiments.

FIG. 11C-1 is an enlarged view of a portion of the semiconductor device structure shown in FIG. 11C, in accordance with some embodiments.

FIGS. 12B-1 is an enlarged view of a portion of the semiconductor device structure of FIG. 12B, in accordance with some embodiments.

FIGS. 12C-1 is an enlarged view of a portion of the semiconductor device structure of FIG. 12C, in accordance with some embodiments.

FIGS. 13D-15D illustrate cross-sectional side views of various stages of manufacturing the semiconductor device structure of FIG. 4 taken along line D-D, in accordance with some embodiments.

DETAILED DESCRIPTION

Figure 1:
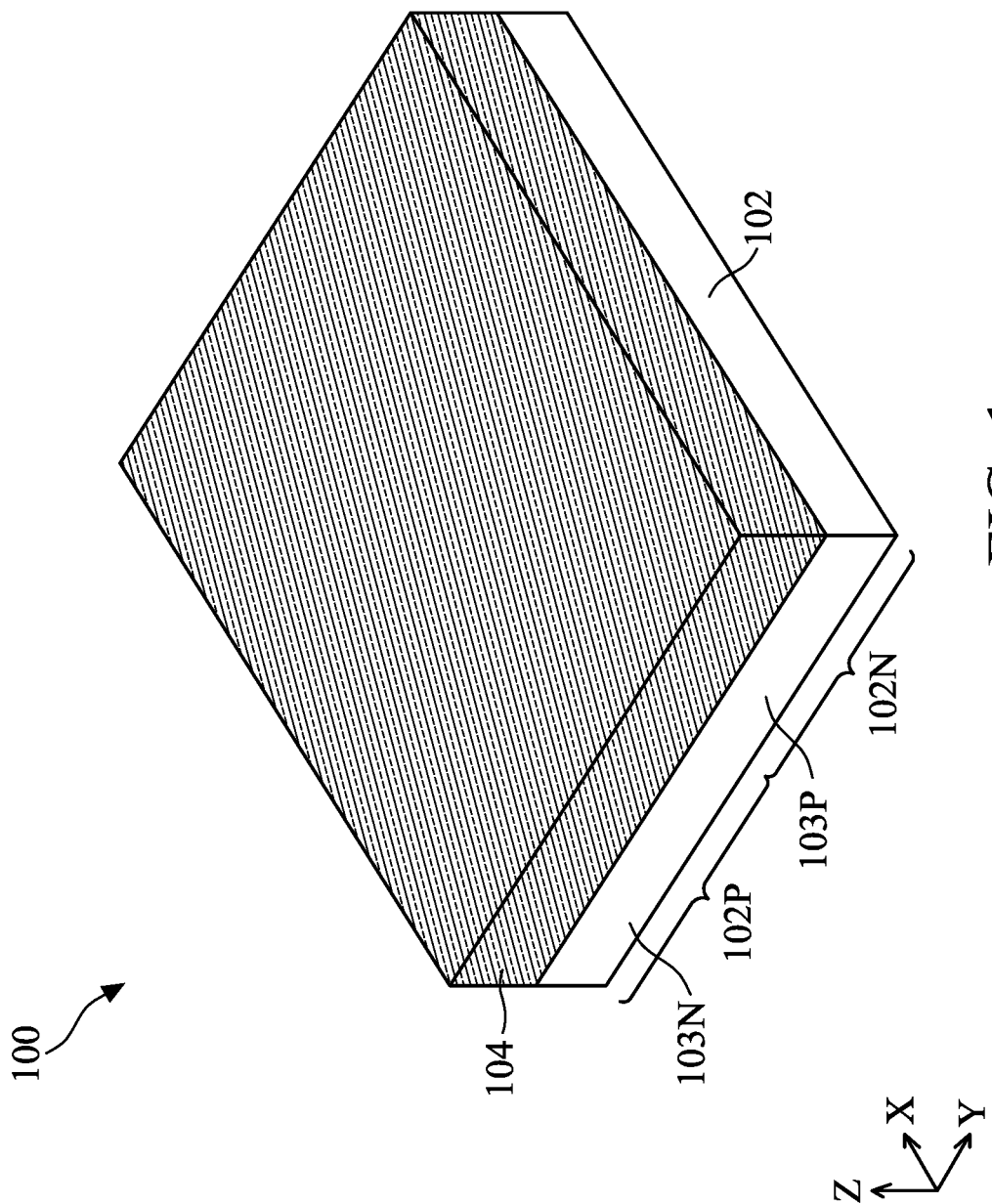
FIGS. 1-4 are perspective views of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-16 illustrate various stages of manufacturing a semiconductor device structure 100 in accordance with various embodiments of this disclosure. It is understood that additional operations can be provided before, during, and after processes shown by FIGS. 1-16 and some of the operations described below can be replaced or eliminated, for additional embodiments of the method. The order of the operations/processes may be interchangeable.

FIGS. 1-4 are perspective views of the semiconductor device structure 100, in accordance with some embodiments. In FIG. 1, a first semiconductor layer 104 is formed on a substrate 102. The substrate may be a part of a chip in a wafer. In some embodiments, the substrate 102 is a bulk semiconductor substrate, such as a semiconductor wafer. For example, the substrate 102 is a silicon wafer. The substrate 102 may include silicon or another elementary semiconductor material such as germanium. In some other embodiments, the substrate 102 includes a compound semiconductor. The compound semiconductor may include gallium arsenide, silicon carbide, indium arsenide, indium phosphide, another suitable semiconductor material, or a combination thereof. In some embodiments, the substrate 102 is a semiconductor-on-insulator (SOI) substrate. The SOI substrate may be fabricated using a separation by implantation of oxygen (SIMOX) process, a wafer bonding process, another applicable method, or a combination thereof.

The substrate 102 may be doped with P-type or N-type impurities. As shown in FIG. 1, the substrate 102 has a P-type region 102P and an N-type region 102N adjacent to the P-type region 102P, in accordance with some embodiments. While not shown in scale in some figures, the P-type region 102P and N-type region 102N belong to a continuous substrate 102. In some embodiments of the present disclosure, the P-type region 102P is used to form a PMOS structure thereon, whereas the N-type region 102N is used to form an NMOS structure thereon. In some embodiments, an N-well region 103N and a P-well region 103P are formed in the substrate 102, as shown in FIG. 1. For example, the N-well region 103N is formed in the substrate 102 in the P-type region 102P, whereas the P-well region 103P is formed in the substrate 102 in the N-type region 102N. The P-well region 103P and the N-well region 103N may be formed by any suitable technique, for example, by separate ion implantation processes in some embodiments. By using two different implantation mask layers (not shown), the P-well region 103P and the N-well region 103N can be sequentially formed in different ion implantation processes.

The first semiconductor layer 104 is deposited over the substrate 102, as shown in FIG. 1. The first semiconductor layer 104 may be made of any suitable semiconductor material, such as silicon, germanium, III-V semiconductor material, or combinations thereof. In some embodiments, the first semiconductor layer 104 is substantially made of silicon. The first semiconductor layer 104 may be formed by an epitaxial growth process, such as metal-organic chemical vapor deposition (MOCVD), metal-organic vapor phase epitaxy (MOVPE), plasma-enhanced chemical vapor deposition (PECVD), remote plasma chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable process.

Figure 2:
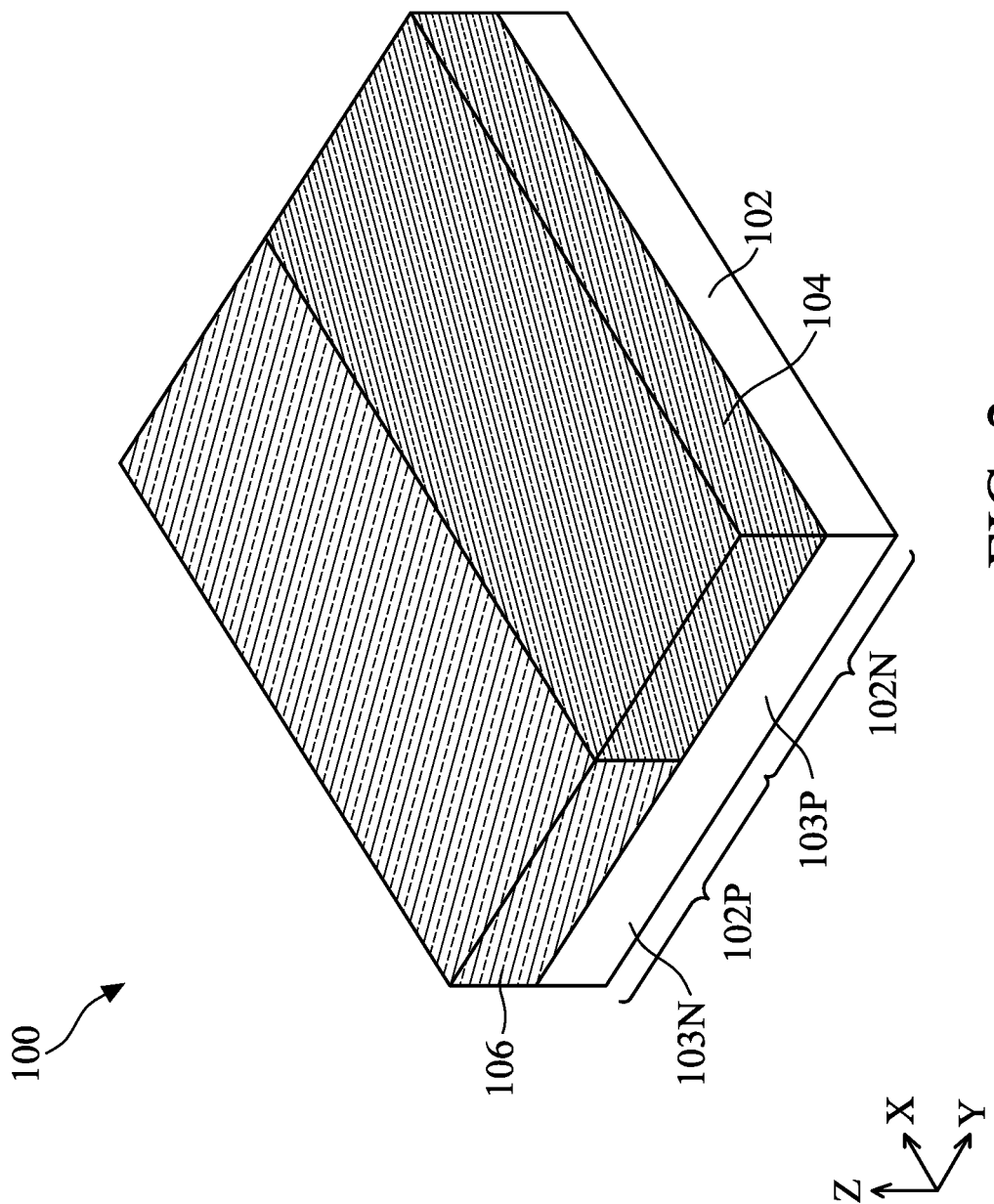

In FIG. 2, the portion of the first semiconductor layer 104 disposed over the N-well region 103N is removed, and a second semiconductor layer 106 is formed over the N-well region 103N and adjacent the portion of the first semiconductor layer 104 disposed over the P-well region 103P. A patterned mask layer (not shown) may be first formed on the portion of the first semiconductor layer 104 disposed over the P-well region 103P, and the portion of the first semiconductor layer 104 disposed over the N-well region 103N may be exposed. A removal process, such as a dry etch, wet etch, or a combination thereof, may be performed to remove the portion of the first semiconductor layer 104 disposed over the N-well region 103N, and the N-well region 103N may be exposed. The removal process does not substantially affect the mask layer (not shown) formed on the portion of the first semiconductor layer 104 disposed over the P-well region 103P, which protects the portion of the first semiconductor layer 104 disposed over the P-well region 103P. Next, the second semiconductor layer 106 is formed on the exposed N-well region 103N. The second semiconductor layer 106 may be made of any suitable semiconductor material, such as silicon, germanium, III-V semiconductor material, or combinations thereof. In some embodiments, the second semiconductor layer 106 is substantially made of silicon germanium. The second semiconductor layer 106 may be formed by the same process as the first semiconductor layer 104. For example, the second semiconductor layer 106 may be formed on the exposed N-well region 103N by an epitaxial growth process, which does not form the second semiconductor layer 106 on the mask layer (not shown) disposed on the first semiconductor layer 104. As a result, the first semiconductor layer 104 is disposed over the P-well region 103P in the N-type region 102N, and the second semiconductor layer 106 is disposed over the N-well region 103N in the P-type region 102P.

Portions of the first semiconductor layer 104 may serve as channels in the subsequently formed NMOS structure in the N-type region 102N. Portions of the second semiconductor layer 106 may serve as channels in the subsequently formed PMOS structure in the P-type region 102P. In some embodiments, the NMOS structure and the PMOS structure are FinFETs. While embodiments described in this disclosure are described in the context of FinFETs, implementations of some aspects of the present disclosure may be used in other processes and/or in other devices, such as planar FETs, nanosheet channel FETs, Horizontal Gate All Around (HGAA) FETs, Vertical Gate All Around (VGAA) FETs, and other suitable devices.

Figure 3:
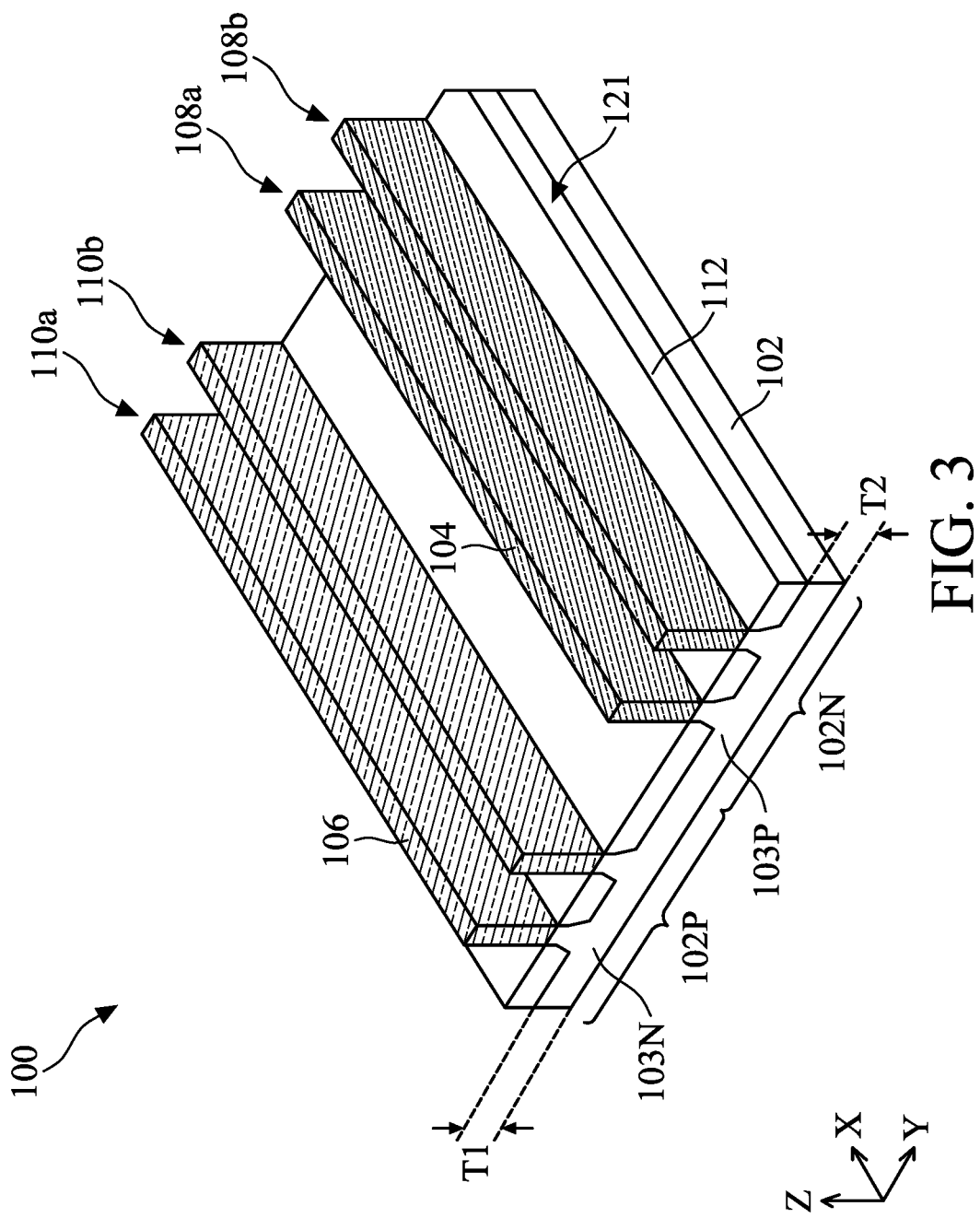

In FIG. 3, a plurality of fins 108a, 108b, 110a, 110b are formed from the first and second semiconductor layers 104, 106, respectively, and STI regions 121 are formed. The fins 108a, 108b, 110a, 110b may be patterned by any suitable method. For example, the fins 108a, 108b, 110a, 110b may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not shown) is formed over a substrate and patterned using a photolithography process. Spacers (not shown) are formed alongside the patterned sacrificial layer using a self-aligned process. The sacrificial layer is then removed, and the remaining spacers may then be used to pattern the substrate and form the fins.

In some embodiments, the substrate 102 at the N-type region 102N may have a thickness different than the thickness at the P-type region 102P. Due to etch loading effects, the first semiconductor layer 104 (e.g., Si) deposited over the substrate 102 at the P-well region 103P and the second semiconductor layer 106 (e.g., SiGe) deposited over the substrate 102 at the N-well region 103N are etched at different rates when exposing to the same etchant used for patterning. The semiconductor material of the first semiconductor layer 104 may have a first etch rate by the etchant while the semiconductor material of the second semiconductor layer 106 may have a second etch rate by the etchant that is faster than the first etch rate. Therefore, portions of the substrate 102 not covered by the second semiconductor layer 106 at the N-well region 103N may be exposed and etched before the substrate 102 at the P-well region 103P is exposed. As a result, a difference in the substrate thickness between the N-well region 103N and the P-well region 103P is created as a result of the formation of the fins 108a, 108b, 110a, 110b. In cases where the first semiconductor layer 104 includes SiGe and the second semiconductor layer 106 includes Si, the substrate 102 at the N-well region 103N may have a thickness T1 measuring from a top surface of the substrate 102 to a bottom surface of the substrate 102, and the substrate 102 at the P-well region 103P may have a thickness T2 measuring from the top surface of the substrate 102 to the bottom surface of the substrate 102, wherein the thickness T2 is less than the thickness T1.

The fins 108a, 108b may each include the first semiconductor layer 104, and a portion of the first semiconductor layer 104 may serve as an NMOS channel. Each fin 108a, 108b may also include the P-well region 103P. Likewise, the fins 110a, 110b may each include the second semiconductor layer 106, and a portion of the second semiconductor layer 106 may serve as a PMOS channel. Each fin 110a, 110b may also include the N-well region 103N. A mask (not shown) may be formed on the first and second semiconductor layers 104, 106, and may remain on the fins 108a-b and 110a-b.

Next, an insulating material 112 is formed between adjacent fins 108a-b, 110a-b. The insulating material 112 may be first formed between adjacent fins 108a-b, 110a-b and over the fins 108a-b, 110a-b, so the fins 108a-b, 110a-b are embedded in the insulating material 112. A planarization process, such as a chemical-mechanical polishing (CMP) process may be performed to expose the top of the fins 108a-b, 110a-b. In some embodiments, the planarization process exposes the top of the mask (not shown) disposed on the fins 108a-b and 110a-b. The insulating material 112 are then recessed by removing a portion of the insulating material 112 located on both sides of each fin 108a-b, 110a-b. The insulating material 112 may be recessed by any suitable removal process, such as dry etch or wet etch that selectively removes the insulating material 112 but does not substantially affect the semiconductor materials of the fins 108a-b, 110a-b. The insulating material 112 may include an oxygen-containing material, such as silicon oxide, carbon or nitrogen doped oxide, or fluorine-doped silicate glass (FSG); a nitrogen-containing material, such as silicon nitride, silicon oxynitride (SiON), SiOCN, SiCN; a low-K dielectric material (e.g., a material having a K value lower than that of silicon dioxide); or any suitable dielectric material. The insulating material 112 may be formed by any suitable method, such as low-pressure chemical vapor deposition (LPCVD), plasma enhanced CVD (PECVD) or flowable CVD (FCVD). The insulating material 112 may be shallow trench isolation (STI) region, and is referred to as STI region 121 in this disclosure.

In some alternative embodiments, instead of forming first and second semiconductor layers 104, 106 over the substrate 102, the fins 108a-b, 110a-b may be formed by first forming isolation regions (e.g., STI regions 121) on a bulk substrate (e.g., substrate 102). The formation of the STI regions may include etching the bulk substrate to form trenches, and filling the trenches with a dielectric material to form the STI regions. The portions of the substrate between neighboring STI regions form the fins. The top surfaces of the fins and the top surfaces of the STI regions may be substantially level with each other by a CMP process. After the STI regions are formed, at least top portions of, or substantially entireties of, the fins are removed. Accordingly, recesses are formed between STI regions. The bottom surfaces of the STI regions may be level with, higher, or lower than the bottom surfaces of the STI regions. An epitaxy is then performed to separately grow first and second semiconductor layers (e.g., first and second semiconductor layers 104, 106) in the recesses created as a result of removal of the portions of the fins, thereby forming fins (e.g., fins 108a-b, 110a-b). A CMP is then performed until the top surfaces of the fins and the top surfaces of the STI regions are substantially co-planar. In some embodiments, after the epitaxy and the CMP, an implantation process is performed to define well regions (e.g., P-well region 103P and N-well region 103N) in the substrate. Alternatively, the fins are in-situ doped with impurities (e.g., dopants having P-type or N-type conductivity) during the epitaxy. Thereafter, the STI regions are recessed so that fins of first and second semiconductor layers (e.g., fins 108a-b, 110a-b) are extending upwardly over the STI regions from the substrate, in a similar fashion as shown in FIG. 3.

Figure 4:
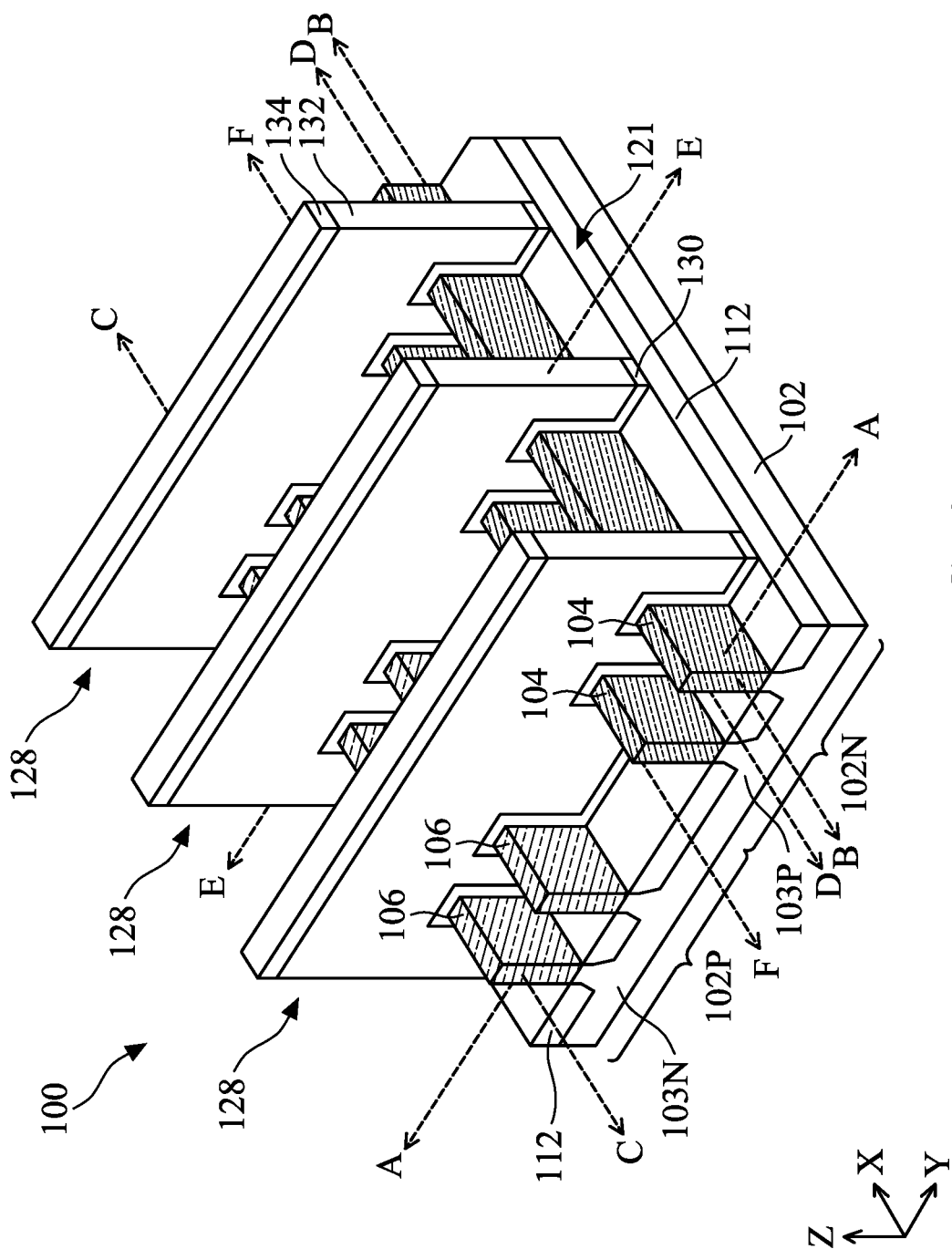

In FIG. 4, one or more sacrificial gate stacks 128 are formed on a portion of the fins 108a-b, 110a-b. Each sacrificial gate stack 128 may include a sacrificial gate dielectric layer 130, a sacrificial gate electrode layer 132, and a mask structure 134. The sacrificial gate dielectric layer 130 may include one or more layers of dielectric material, such as $SiO_2$, SiN, a high-K dielectric material, and/or other suitable dielectric material. In some embodiments, the sacrificial gate dielectric layer 130 includes a material different than that of the insulating material 112 or the high-K dielectric material 120. In some embodiments, the sacrificial gate dielectric layer 130 may be deposited by a CVD process, a sub-atmospheric CVD (SACVD) process, a FCVD process, an ALD process, a PVD process, or other suitable process. The sacrificial gate electrode layer 132 may include polycrystalline silicon (polysilicon). The mask structure 134 may include an oxygen-containing layer and a nitrogen-containing layer. In some embodiments, the sacrificial gate electrode layer 132 and the mask structure 134 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 128 may be formed by first depositing blanket layers of the sacrificial gate dielectric layer 130, the sacrificial gate electrode layer 132, and the mask structure 134, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stacks 128, the fins 108a-b, 110a-b are partially exposed on opposite sides of the sacrificial gate stacks 128. While three sacrificial gate stacks 128 are shown in FIG. 4, it can be appreciated that they are for illustrative purpose only and any number of the sacrificial gate stacks 128 may be formed.

Figure 5A:
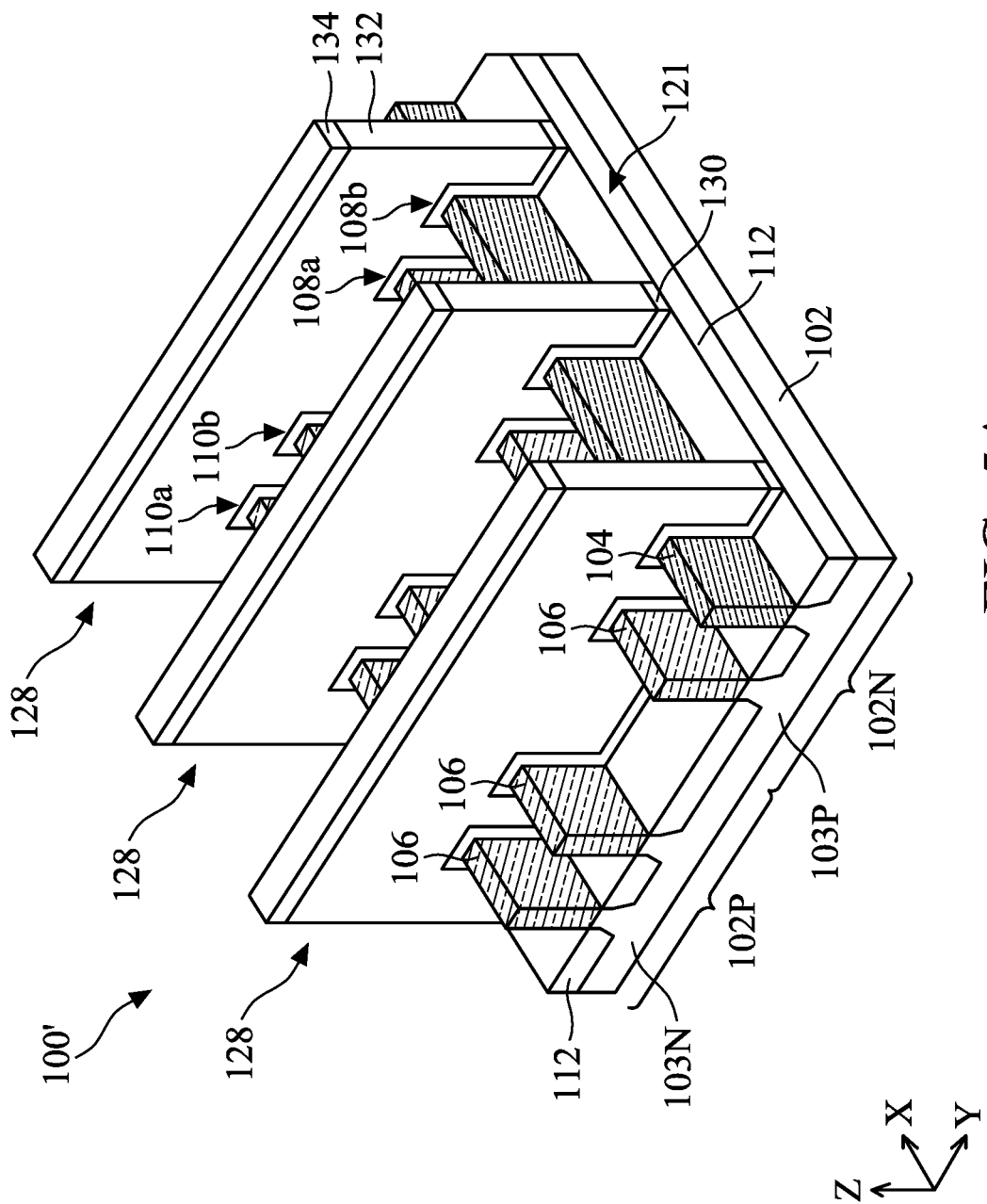
FIG. 5A is a perspective view of one stage of manufacturing a semiconductor device structure, in accordance with an alternative embodiment.

FIG. 5A is a perspective view of one stage of manufacturing a semiconductor device structure 100', in accordance with an alternative embodiment. In the embodiment shown in FIG. 5A, the semiconductor device structure 100' is substantially identical to the semiconductor device structure 100 except that one of the fins 108a-b (e.g., fin 108a) in the N-type region 102N is formed of the second semiconductor layer 106, and the other fin 108b in the N-type region 102N is formed of the first semiconductor layer 104. In such cases, the subsequent S/D epitaxial features 152 formed on the fins 108a and 108b in the N-type region 102N may be Si or SiGe. Various embodiments to be discussed with respect to FIGS. 6A-16 can be performed on or combined with the embodiment shown in FIG. 5A.

Figure 5B:
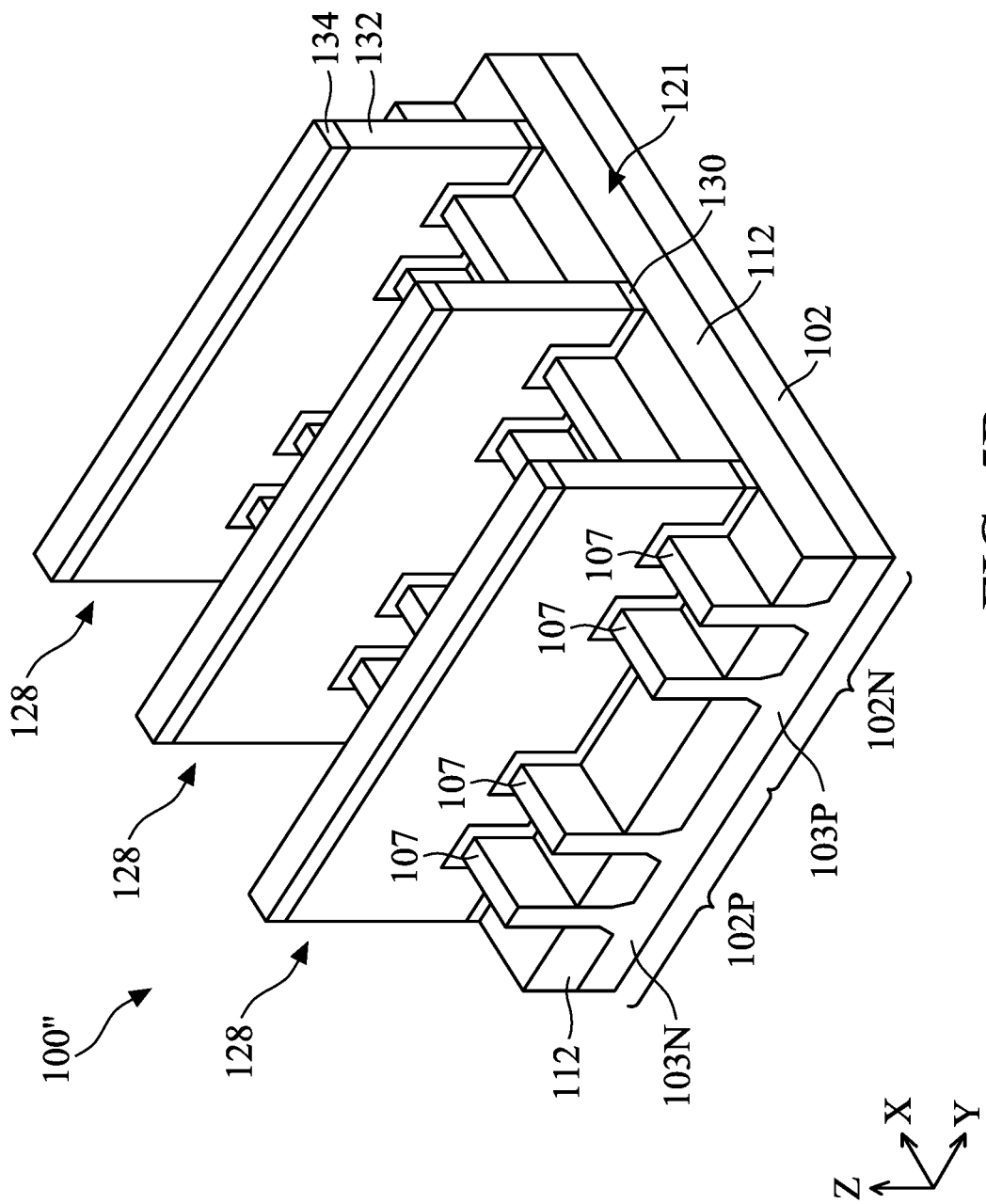
FIG. 5B is a perspective view of one stage of manufacturing a semiconductor device structure, in accordance with an alternative embodiment.

FIG. 5B is a perspective view of one stage of manufacturing a semiconductor device structure 100", in accordance with an alternative embodiment. In the embodiment shown in FIG. 5B, the semiconductor device structure 100" is substantially identical to the semiconductor device structure 100 except that the sacrificial gate stacks 128 are formed on a portion of fins 107 that are formed directly from a bulk substrate (e.g., substrate 102), which may be doped with P-type or N-type impurities to form well regions (e.g., P-well region 103P and N-well region 103N). Therefore, the fins 107 are formed of the same material as the substrate 102. In one exemplary embodiment, the fins 107 and the substrate 102 are formed of silicon. Various embodiments to be discussed with respect to FIGS. 6A-16 can be performed on or combined with the embodiment shown in FIG. 5B.

FIGS. 6A-15A are cross-sectional side views of various stages of manufacturing the semiconductor device structure 100 of FIG. 4 taken along line A-A, in accordance with some embodiments. FIGS. 6B-15B are cross-sectional side views of various stages of manufacturing the semiconductor device structure 100 of FIG. 4 taken along line B-B, in accordance with some embodiments. FIGS. 6C-15C are cross-sectional side views of various stages of manufacturing the semiconductor device structure 100 of FIG. 4 taken along line C-C, in accordance with some embodiments. Lines A-A, B-B, and C-C correspond to lines A-A, B-B, and C-C shown in a schematic layout 1600 of FIG. 16.

Figure 6A:
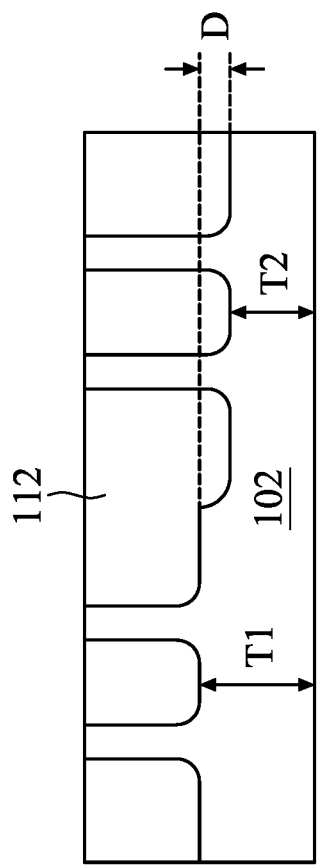
FIG. 6A' is an enlarged view of a portion of the substrate shown in FIG. 6A, in accordance with some embodiments.
Figure 6A:
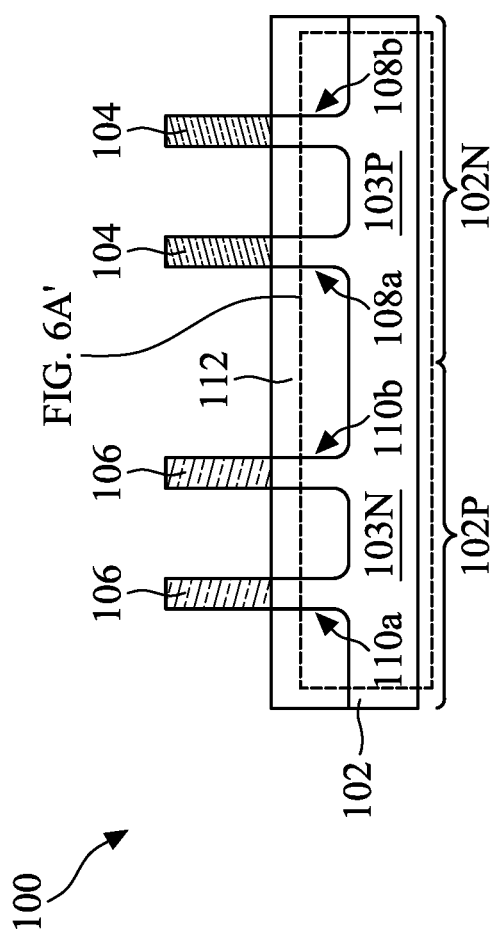
Figure 6B:
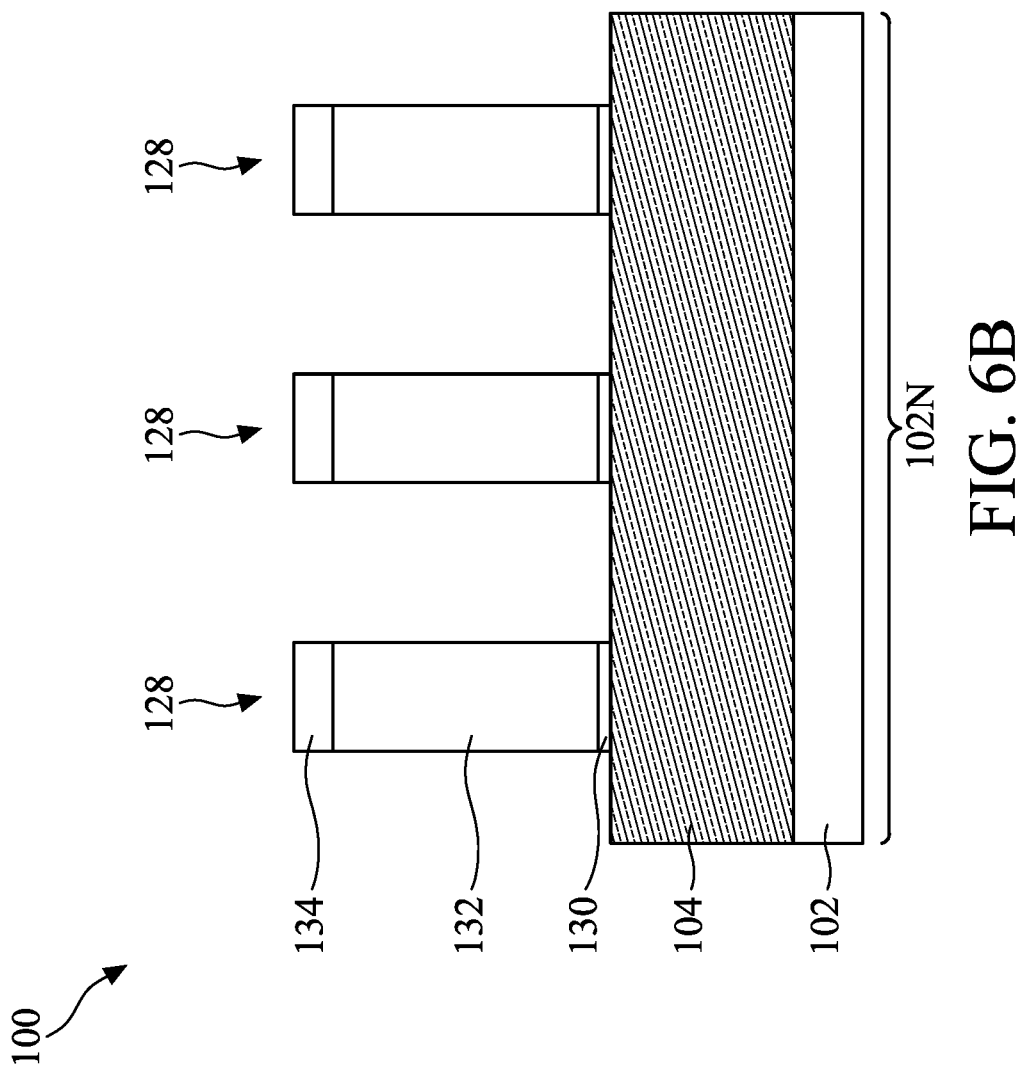
Figure 6C:
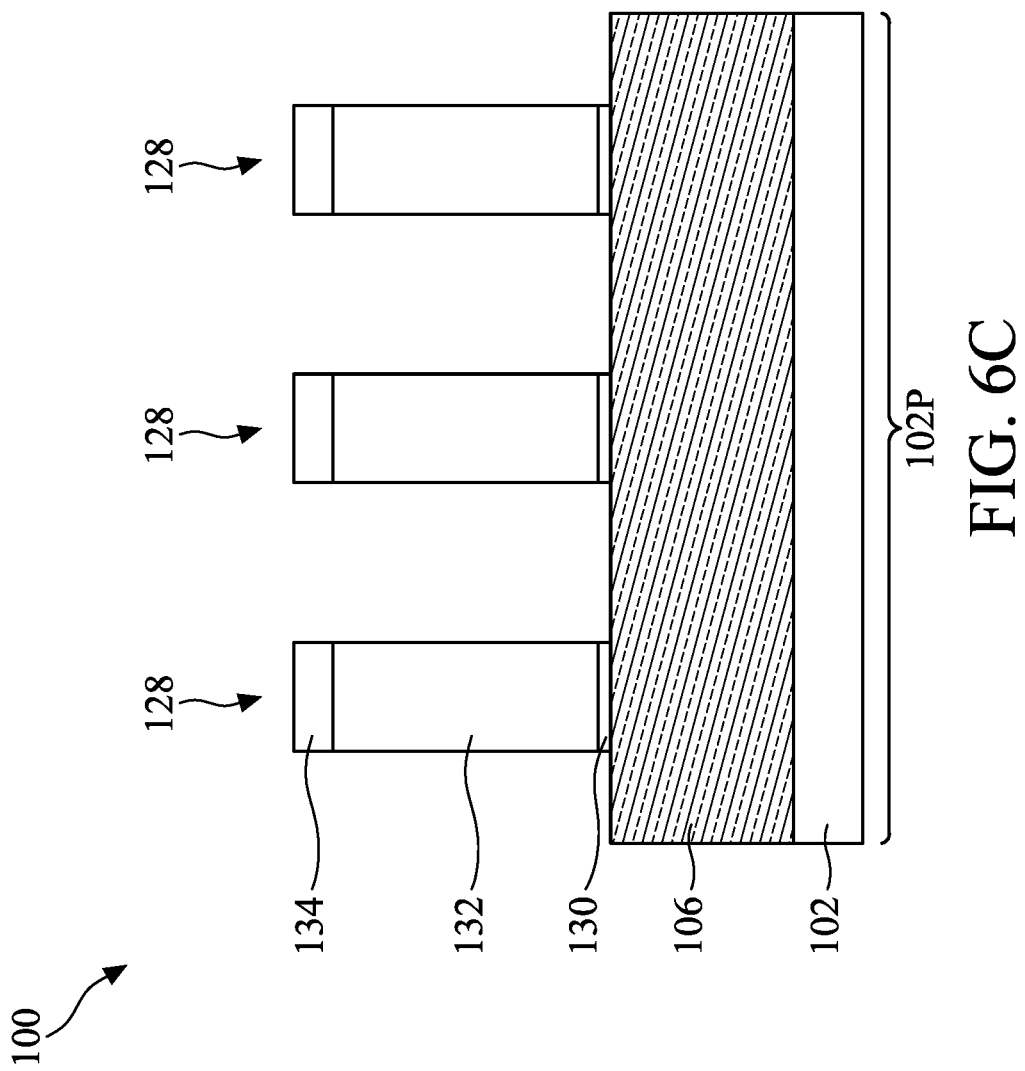

FIGS. 6A-6C illustrate a stage after the sacrificial gate stacks 128 are formed on a portion of the fins 108a-b, 110a-b. FIG. 6A' is an enlarged view of a portion of the substrate 102 of FIG. 6A showing the substrate 102 at the P-type region 102P may have a greater thickness than the thickness at the N-type region 102N due to etch loading effects, as discussed previously. In some embodiments, which can be combined with any other embodiment(s) in this disclosure, the difference D in height between thickness T1 and thickness T2 may be in a range of about 0.1% to about 5%.

Figure 7A:
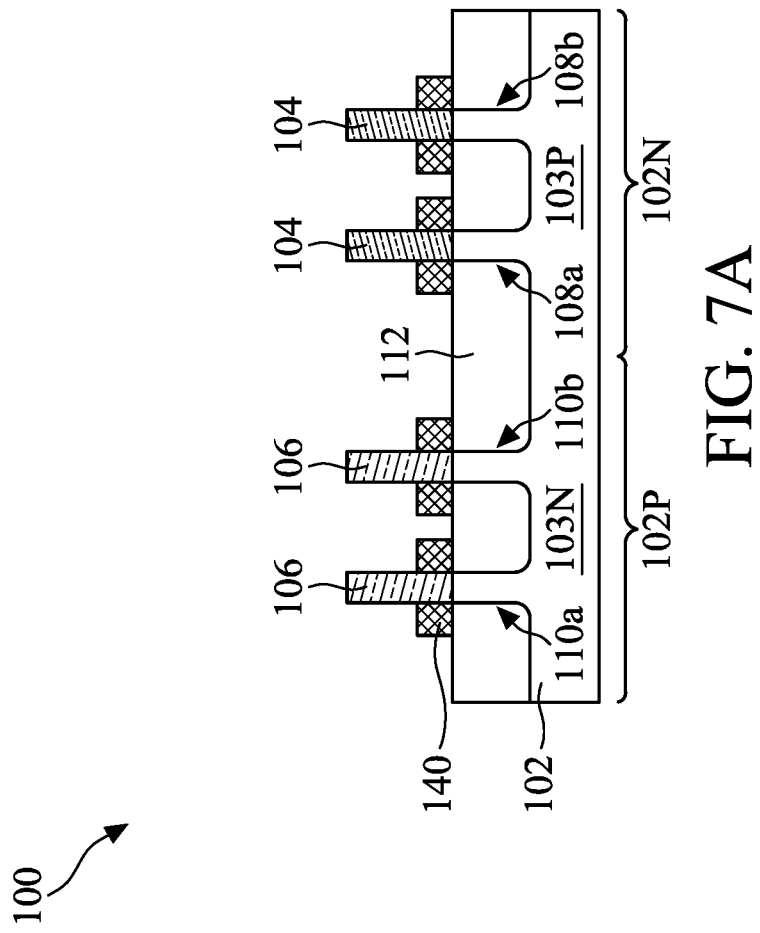
Figure 7B:
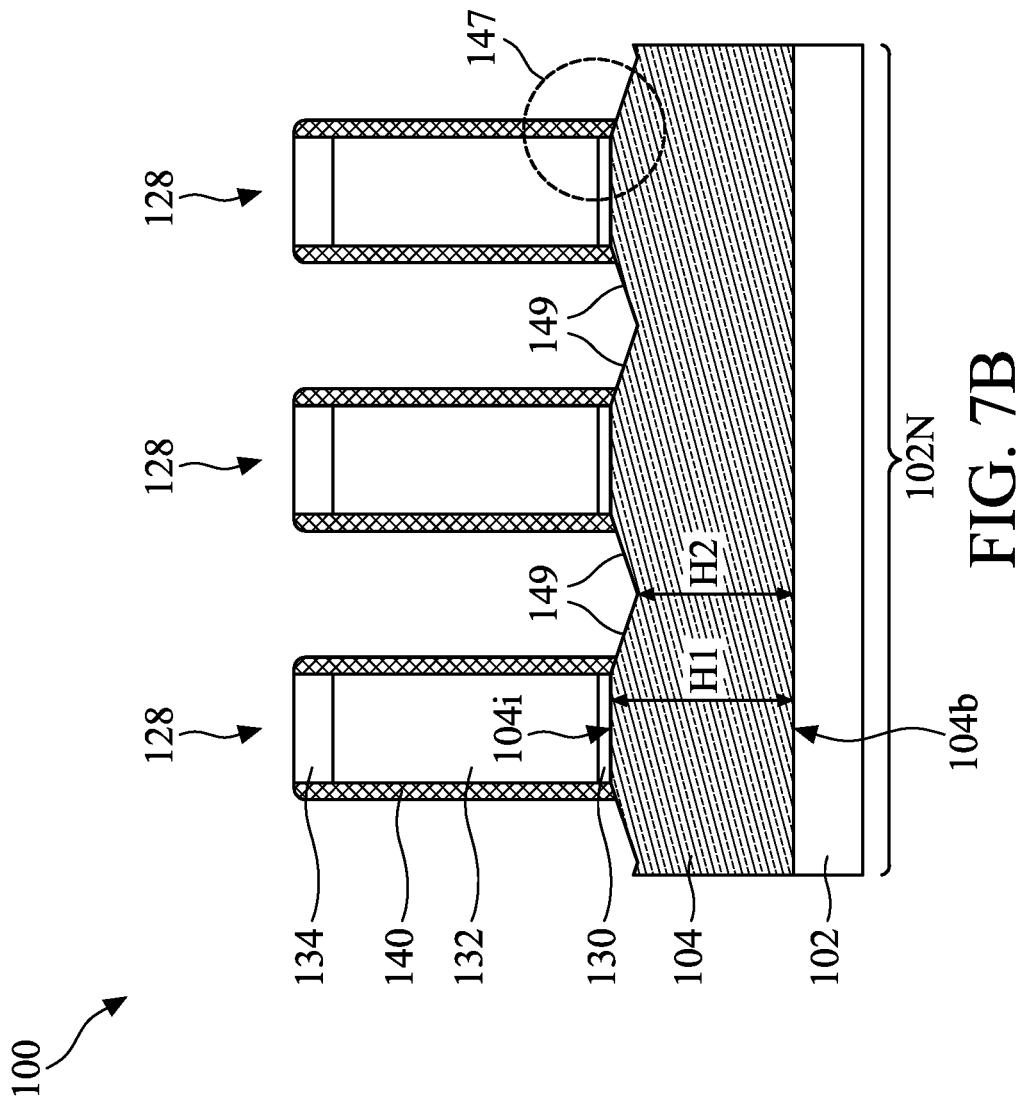
Figures 1, 7B:
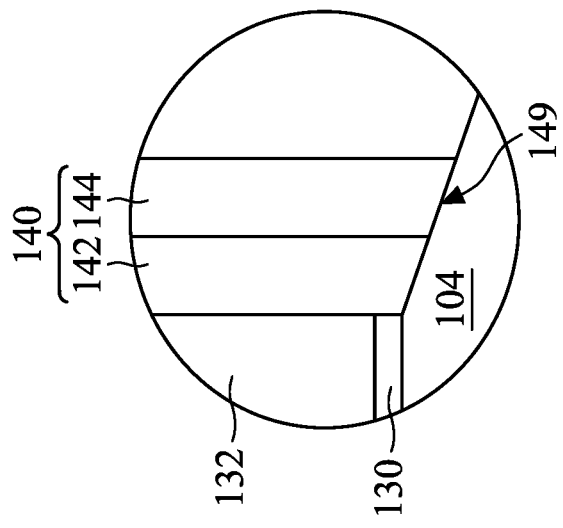
Figures 2, 7B:
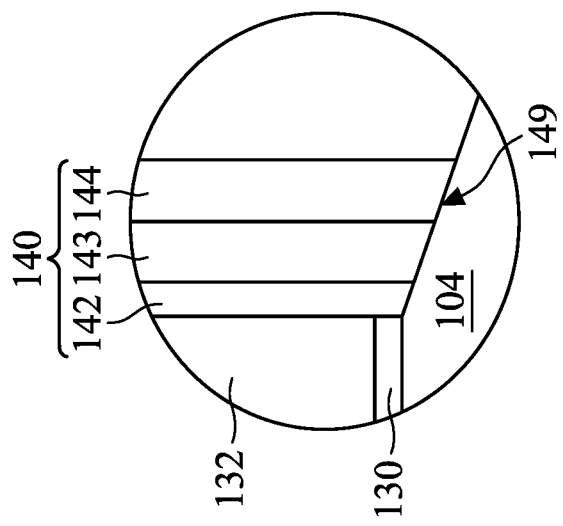
Figures 3, 7B:
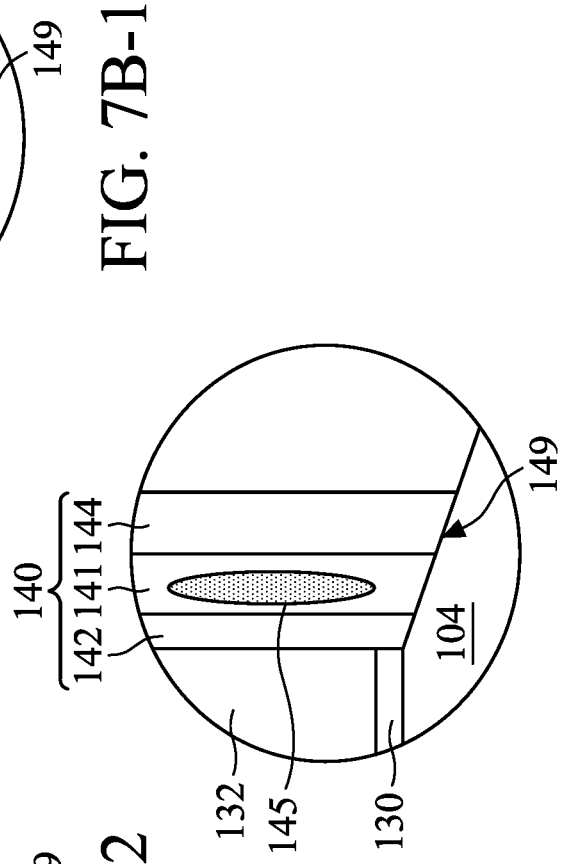
Figure 7C:
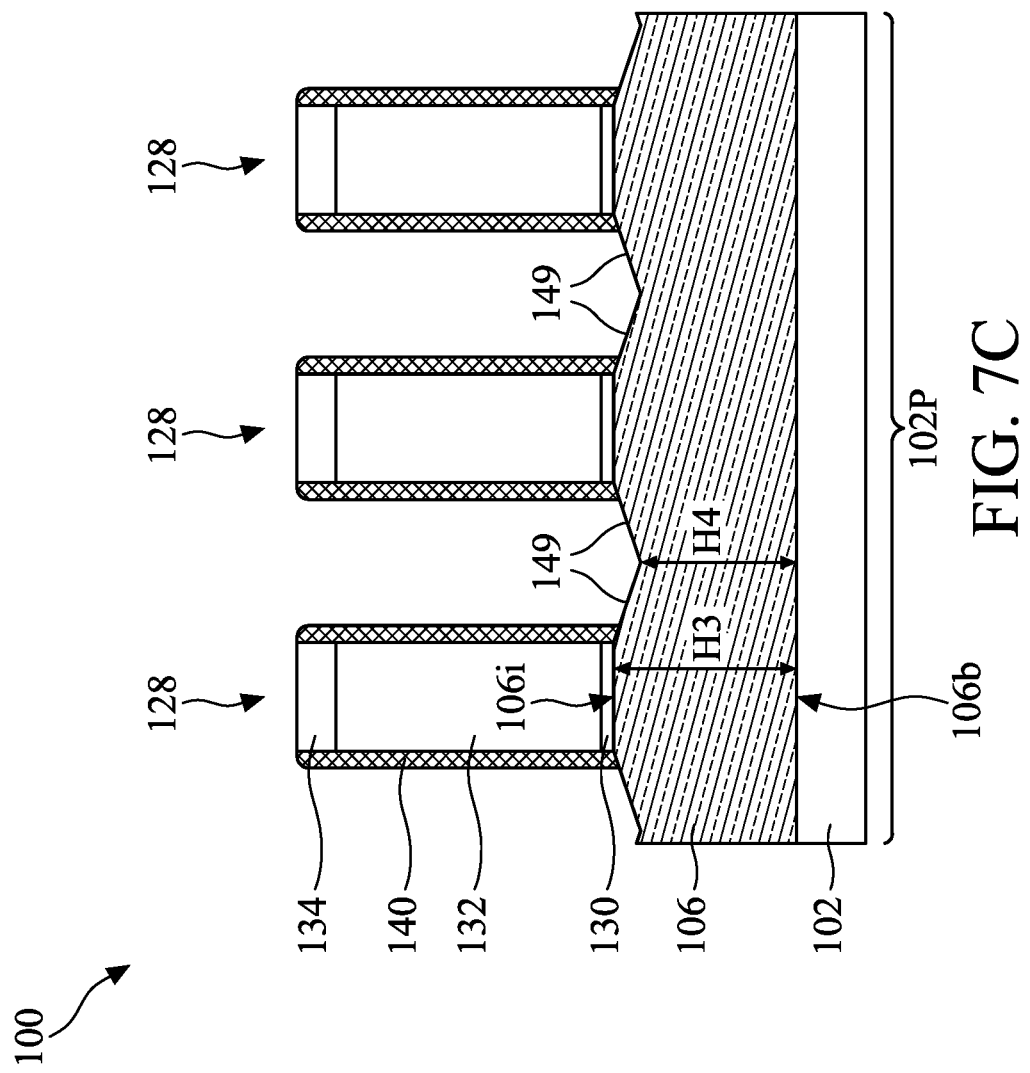

In FIGS. 7A-7C, a spacer 140 is formed on the sacrificial gate stacks 128 and the exposed portions of the first and second semiconductor layers 104, 106. The spacer 140 may be conformally deposited on the exposed surfaces of the semiconductor device structure 100. The conformal spacer 140 may be formed by ALD or any suitable processes. An anisotropic etch is then performed on the spacer 140 using, for example, RIE. During the anisotropic etch process, most of the spacer 140 is removed from horizontal surfaces, such as tops of the sacrificial gate stacks 128 and tops of the fins 108a-b, 110a-b, leaving the spacer 140 on the vertical surfaces, such as on opposite sidewalls of the sacrificial gate stacks 128. The spacers 140 may partially remain on opposite sidewalls of the fins 108a-b, 110a-b, as shown in FIG. 7A. In some embodiments, the spacers 140 formed on the source/drain regions of the fins 108a-b, 110a-b are fully removed.

The spacer 140 may be made of a dielectric material such as silicon oxide ($SiO_2$), silicon nitride ($Si_3N_4$), silicon carbide (SiC), silicon oxynitride (SiON), silicon carbon-nitride (SiCN), silicon oxycarbide (SiOC), silicon oxycarbonitride (SiOCN), air gap, and/or any combinations thereof. In some embodiments, the spacer 140 include one or more layers of the dielectric material discussed above. FIG. 7B-1 illustrates an enlarged view of a region 147 of the semiconductor device structure 100 according to one embodiment. In the embodiment of FIG. 7B-1, the spacer 140 is a bi-layer structure including a first layer 142 and a second layer 144. The first layer 142 is in contact with the sacrificial gate stacks 128, and the second layer 144 is in contact with the first layer 142 and separated from the sacrificial gate stacks 128 by the first layer 142. In such cases, the first and second layers 142, 144 may be any dielectric material discussed above. For example, the first layer 142 is $Si_3N_4$ and the second layer 144 is $SiO_2$, or vice versa.

In some embodiments, the spacer 140 may include more than two layers. FIG. 7B-2 illustrates an enlarged view of a region 147 of the semiconductor device structure 100 according to another embodiment. In the embodiment of FIG. 7B-2, the spacer 140 is a tri-layer structure including the first layer 142, the second layer 144, and a third layer 143 disposed between the first layer 142 and the second layer 144. The first, second, and third layers 142, 144, 143 may be any dielectric material discussed above. In one embodiment, the first layer 142 is a dielectric material having a first dielectric constant (K) value, the third layer 143 is a dielectric material having a second K value lower than the first K value, and the second layer 144 is a dielectric material having a third K value lower than the second K value. For example, the first layer 142 is $Si_3N_4$ the third layer 143 is SiON, and the second layer 144 is $SiO_2$.

FIG. 7B-3 illustrates an enlarged view of a region 147 of the semiconductor device structure 100 according to yet another embodiment. In the embodiment of FIG. 7B-3, the spacer 140 is a tri-layer structure including the first layer 142, the second layer 144, and a third layer 141 disposed between the first layer 142 and the second layer 144. The third layer 141 may be a layer including air gaps 145. The air gaps 145 may be formed by sequentially depositing the first layer 142, the third layer 141, and the second layer 144 on exposed surfaces of the semiconductor device structure 100, followed by removing portions of the third layer 141 to form air gaps 145 in the third layer 141. In such cases, the first and second layers 142, 144 may be $Si_3N_4$ or $SiO_2$, respectively, and the third layer 141 may be a sacrificial layer formed of amorphous silicon, polysilicon, or the like. The removal of portions of the third layer 141 may use an etchant that selectively removes the third layer 141 (e.g., amorphous silicon) without substantially etching the first and second layers 142, 144.

In various embodiments where the spacer 140 includes multiple layers, the top portion of the fins 108a-b, 110a-b not covered by the sacrificial gate stacks 128 may have a taper profile 149, as shown in FIGS. 7B, 7B-1, 7B-2, and 7B-3. The taper profile 149 may be formed as a result of multiple exposure of the first and second semiconductor layers 104, 106 to etchants used during formation of the spacer 140. For example, after the first layer (e.g., first layer 142) of the spacer 140 is formed on the sacrificial gate stacks 128 and a portion of the first and second semiconductor layers 104, 106, a first treatment process is performed to remove native oxides from the exposed portions of the first and second semiconductor layers 104, 106 not covered by the sacrificial gate stacks 128 and the first layer 142. The first treatment process may be an anneal process, an etch process, or a combination thereof. Thereafter, the second layer (e.g., second layer 144) of the spacer 140 is formed on the first layer 142 and a portion of the exposed first and second semiconductor layers 104, 106. A second treatment process, which may be an anneal process, an etch process, or a combination thereof, is then performed to remove native oxides again formed on the exposed portions of the first and second semiconductor layers 104, 106 not covered by the sacrificial gate stacks 128, the first layer, and the second layer 144. Since the first and second semiconductor layers 104, 106 away from the sacrificial gate stacks 128 suffer more loss of material due to multiple exposure of the annealing/chemicals by the first and second treatment processes than the first and second semiconductor layers 104, 106 adjacent the sacrificial gate stacks 128, a taper profile 149 can be formed in the top portion of the fins 108a-b, 110a-b under the spacer 140.

As can be seen in FIG. 7B, the first semiconductor layer 104 (of the fin 108a-b) has a height H1 measuring from an interface 104i defined between the sacrificial gate stack 128 and the first semiconductor layer 104 to a bottom 104b of the first semiconductor layer 104. The height H1 is gradually decreased along the direction away from the interface 104i to a height H2 measuring from the lowest point of the top portion of the first semiconductor layer 104 to the bottom 104b of the first semiconductor layer 104. In some embodiments, the height H1 is greater than the height H2 by about 1 nm to about 5 nm. The difference between the height H1 and the height H2 defines the taper profile 149 of the first semiconductor layer 104.

Likewise, as can be seen in FIG. 7C, the second semiconductor layer 106 (of the fin 110a-b) has a height H3 measuring from an interface 106i defined between the sacrificial gate stack 128 and the second semiconductor layer 106 to a bottom 106b of the second semiconductor layer 106. The height H3 is gradually decreased along the direction away from the interface 106i to a height H4 measuring from the lowest point of the top portion of the second semiconductor layer 106 to the bottom 106b of the second semiconductor layer 106. In some embodiments, the height H3 is greater than the height H4 by about 1 nm to about 5 nm. The difference between the height H3 and the height H4 defines the taper profile 149 of the second semiconductor layer 106. The taper profile 149 between adjacent sacrificial gate stacks 128 forms a shallow V-shaped top surface in the first and second semiconductor layers 104, 106, respectively.

Figure 8A:
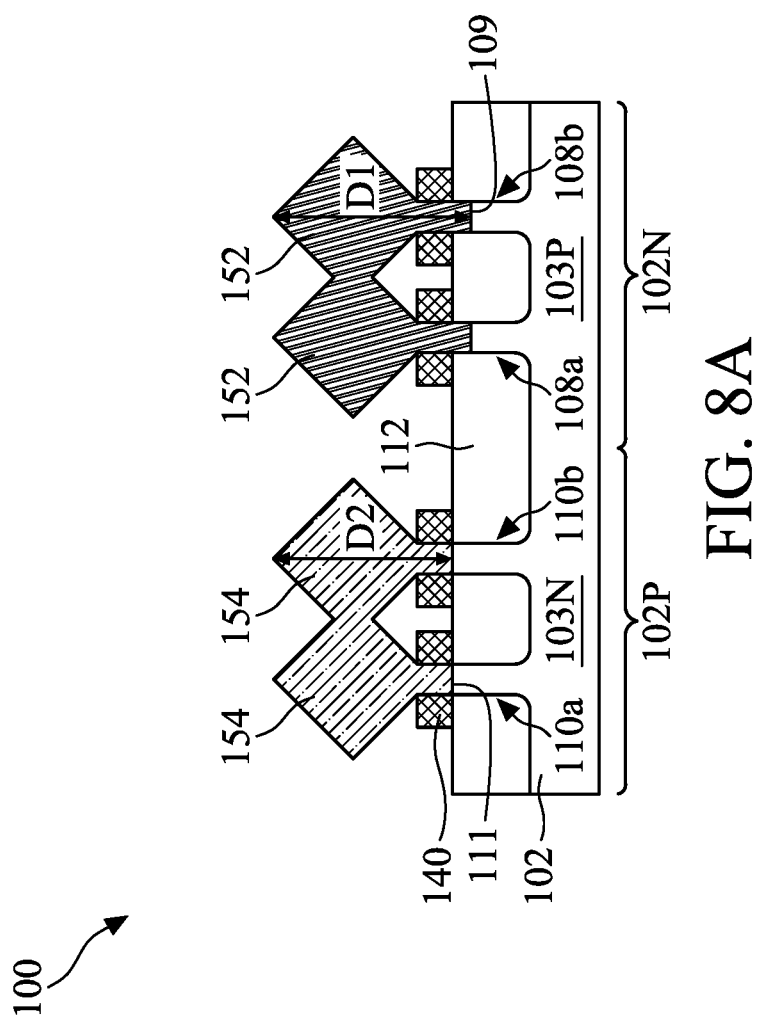
Figure 8B:
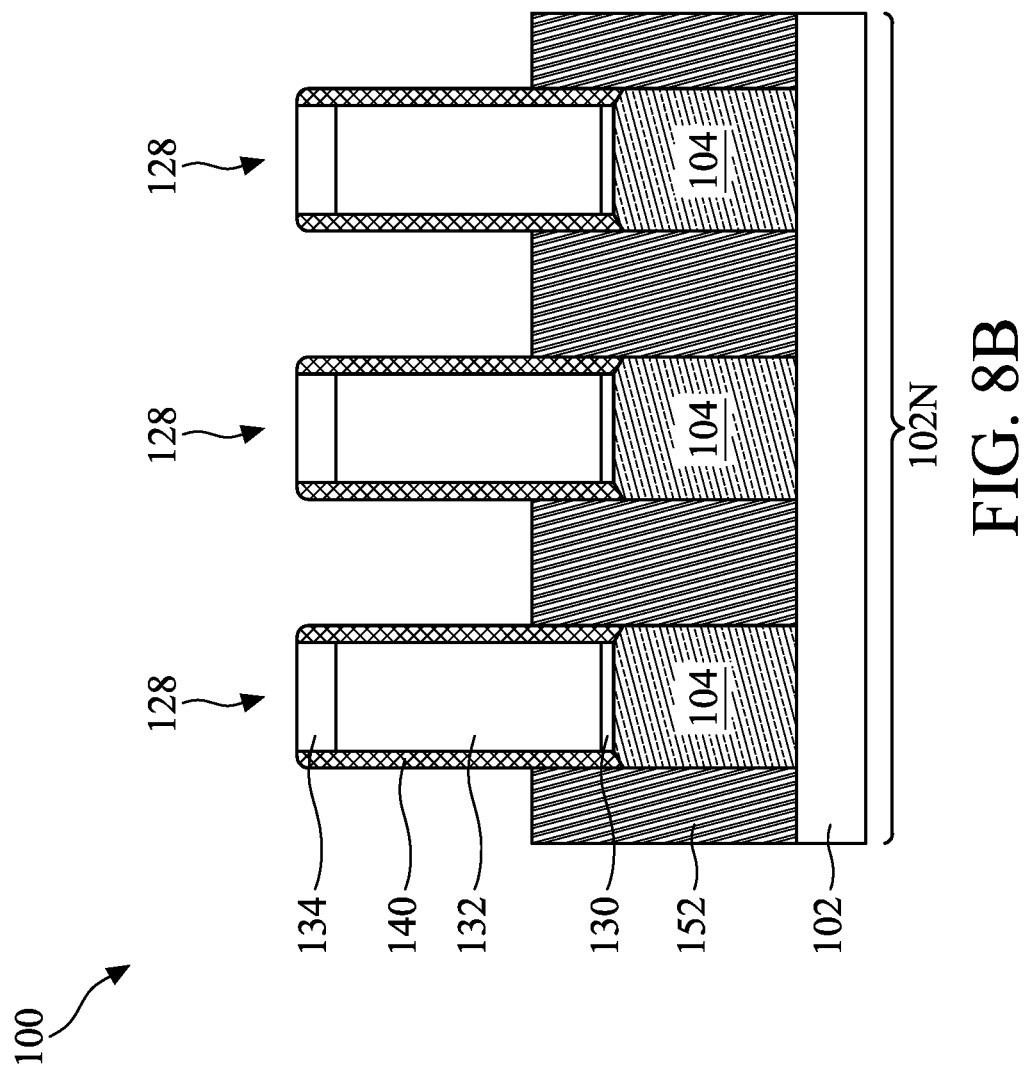
Figure 8C:
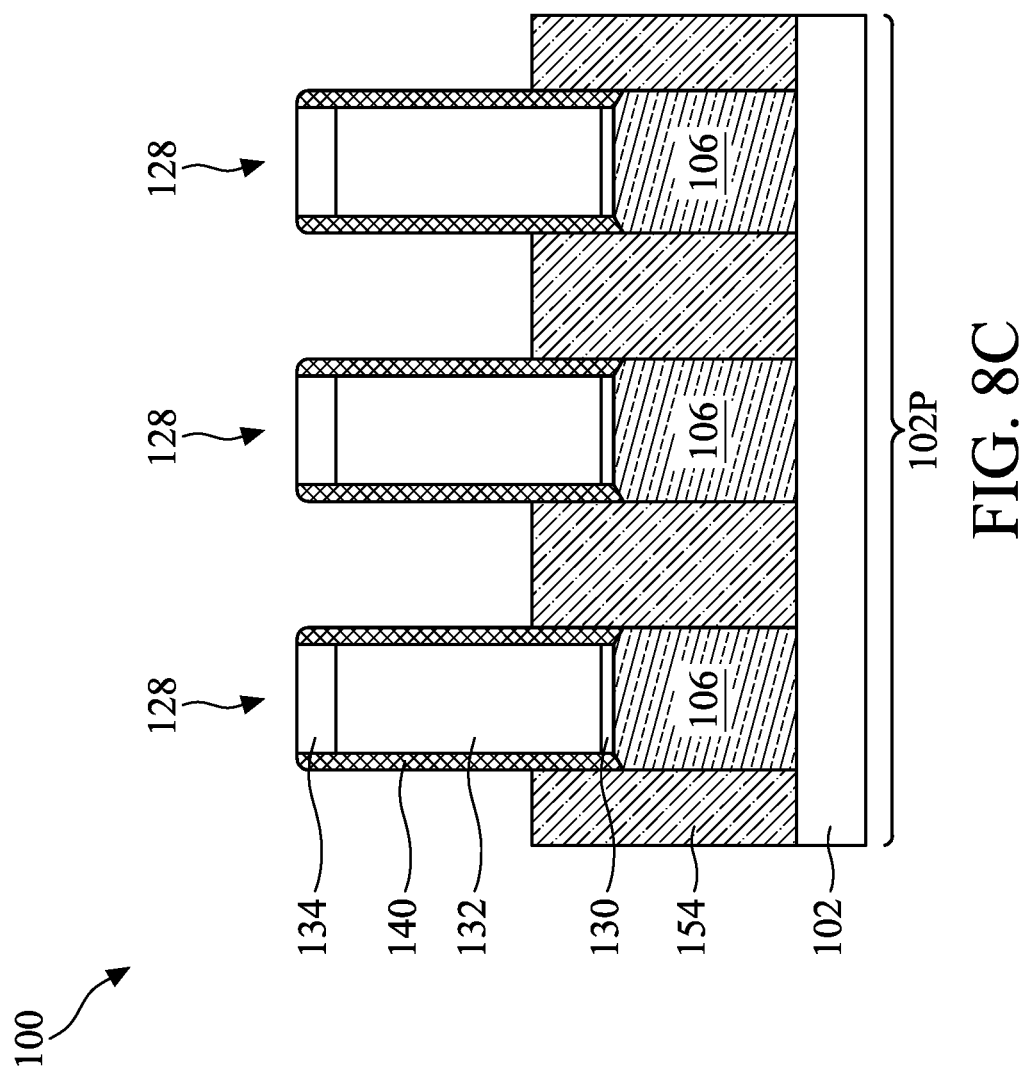

In FIGS. 8A-8C, the first and second semiconductor layers 104, 106 of the fins 108a-b, 110a-b not covered by the sacrificial gate stacks 128 and the spacers 140 are recessed, and source/drain (S/D) epitaxial features 152, 154 are formed. The etchant for recessing of the first and second semiconductor layers 104, 106 is selected so different materials have different etch rates. For example, the first semiconductor layer 104 of the fins 108a-b may have a first etch rate by the etchant, and the second semiconductor layer 106 of the fins 110a-b may have a second etch rate by the etchant. In the embodiments where the first semiconductor layer 104 in the N-type region 102N and the second semiconductor layer 106 in the P-type region 102P each includes different materials (e.g., first semiconductor layer 104 in the N-type region 102N is SiGe and second semiconductor layer 106 in the P-type region 102P is Si), the first etch rate is faster than the second etch rate. A portion of the P-well region 103P of the fins 108a-b can be slightly etched before the second semiconductor layer 106 in the P-type region 102P is fully etched away. As a result, a top surface 109 of the fins 108a-b at the N-type region 102N is at a level below (e.g., about 2 nm to about 10 nm below) a top surface 111 of the fins 110a-b at the P-type region 102P, resulting in a deeper S/D junction depth in the N-type region 102N than that of the P-type region 102P. In some embodiments, the S/D epitaxial features 152 may have a depth D1 measuring from a top to a bottom of the S/D epitaxial feature 152, and the S/D epitaxial features 154 may have a depth D2 measuring from a top to a bottom of the S/D epitaxial feature 154, whereas the D1 is greater than D2. In one example, the D1 is in a range between about 40 nm to about 70 nm and the D2 is in a range between about 35 nm to about 60 nm. While not shown, it is contemplated that such a difference between the top surface 109 and the top surface 111 is applicable to various embodiments of this disclosure.

For devices in the N-type region 102N, each S/D epitaxial features 152 may include one or more layers of Si, SiP, SiC, SiCP, SiAs, or a group III-V material (InP, GaAs, AlAs, InAs, InAlAs, InGaAs). In some embodiments, each S/D epitaxial feature 152 includes two or more layers of Si, SiP, SiC, SiCP or the group III-V material, and each layer may have a different silicon concentration. Each S/D epitaxial feature 152 may include N-type dopants, such as phosphorus (P), arsenic (As), or other suitable N-type dopants. The S/D epitaxial features 152 may be formed by any suitable method, such as CVD, CVD epitaxy, MBE, or other suitable method. The S/D epitaxial features 152 may be formed on the exposed surface of the fins 108a-b on both sides of each sacrificial gate stack 128, as shown in FIG. 8B. In some embodiments, the portions of the first semiconductor layer 104 on both sides of each sacrificial gate stack 128 are completely removed, and the S/D epitaxial features 152 are formed on the P-well region 103P of the fins 108a-b. The S/D epitaxial features 152 may grow both vertically and horizontally to form facets, which may correspond to crystalline planes of the material used for the substrate 102. In some embodiments, the S/D epitaxial features 152 formed on the P-well region 103P of the fins 108a and 108b are merged, as shown in FIG. 8A. The S/D epitaxial features 152 may each have a top surface at a level higher than a top surface of the first semiconductor layer 104, as shown in FIG. 8B.

For devices in the P-type region 102P, each S/D epitaxial features 154 may include one or more layers of Si, SiGe, SiGeB, Ge, or a group III-V material (InSb, GaSb, InGaSb), and each layer may have a different silicon or germanium concentration. Each S/D epitaxial feature 154 may include P-type dopants, such as boron (B) or other suitable P-type dopants. In some embodiments, the S/D epitaxial features 152 in the N-type region 102N and the S/D epitaxial features 154 in the P-type region 102P are both Si. In some embodiments, the S/D epitaxial features 152 in the N-type region 102N are SiGe and the S/D epitaxial features 154 in the P-type region 102P are Si. The S/D epitaxial features 154 may be formed by any suitable method, such as CVD, CVD epitaxy, MBE, or other suitable method. In some embodiments, the portions of the second semiconductor layer 106 on both sides of each sacrificial gate stack 128 are completely removed, and the S/D epitaxial features 154 are formed on the N-well region 103N of the fins 110a-b. The S/D epitaxial features 154 may grow both vertically and horizontally to form facets, which may correspond to crystalline planes of the material used for the substrate 102. In some embodiments, the S/D epitaxial features 154 formed on the N-well region 103N of the fins 110a and 110b are merged, as shown in FIG. 8A. The S/D epitaxial features 154 may each have a top surface at a level higher than a top surface of the second semiconductor layer 106, as shown in FIG. 8C.

Figure 9A:
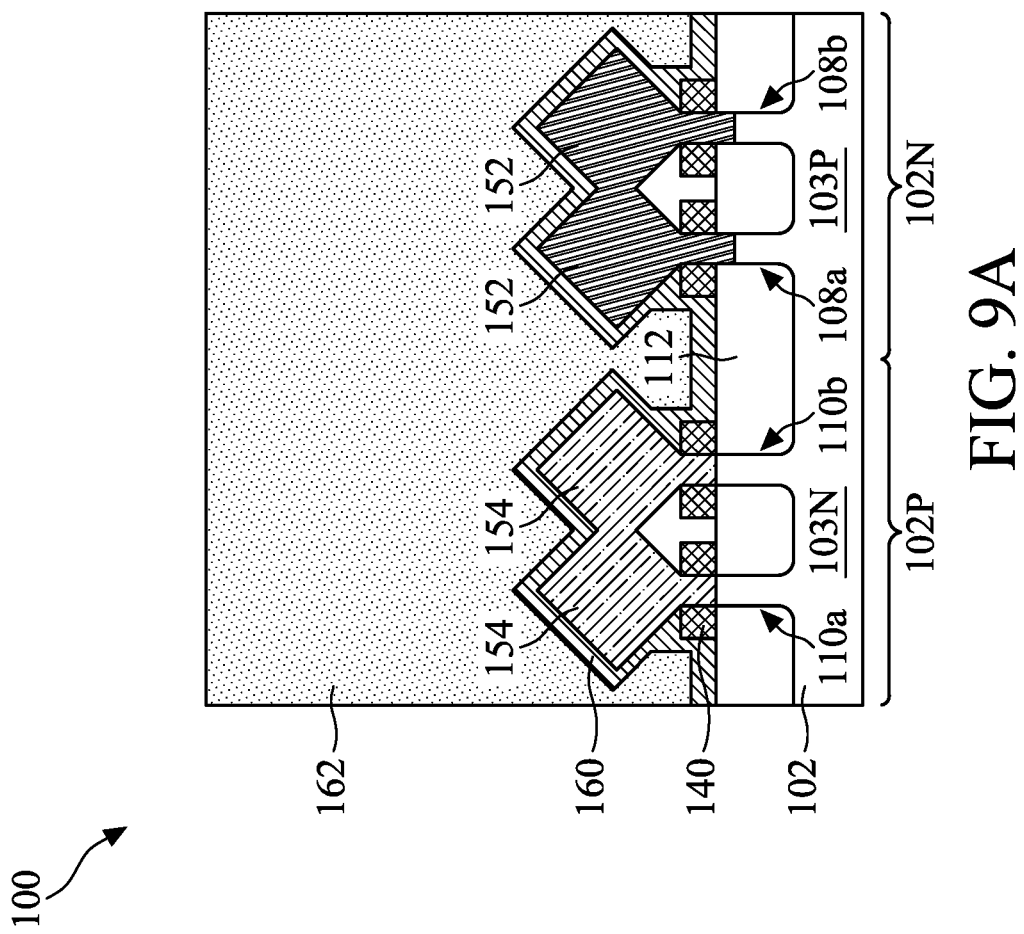
Figure 9B:
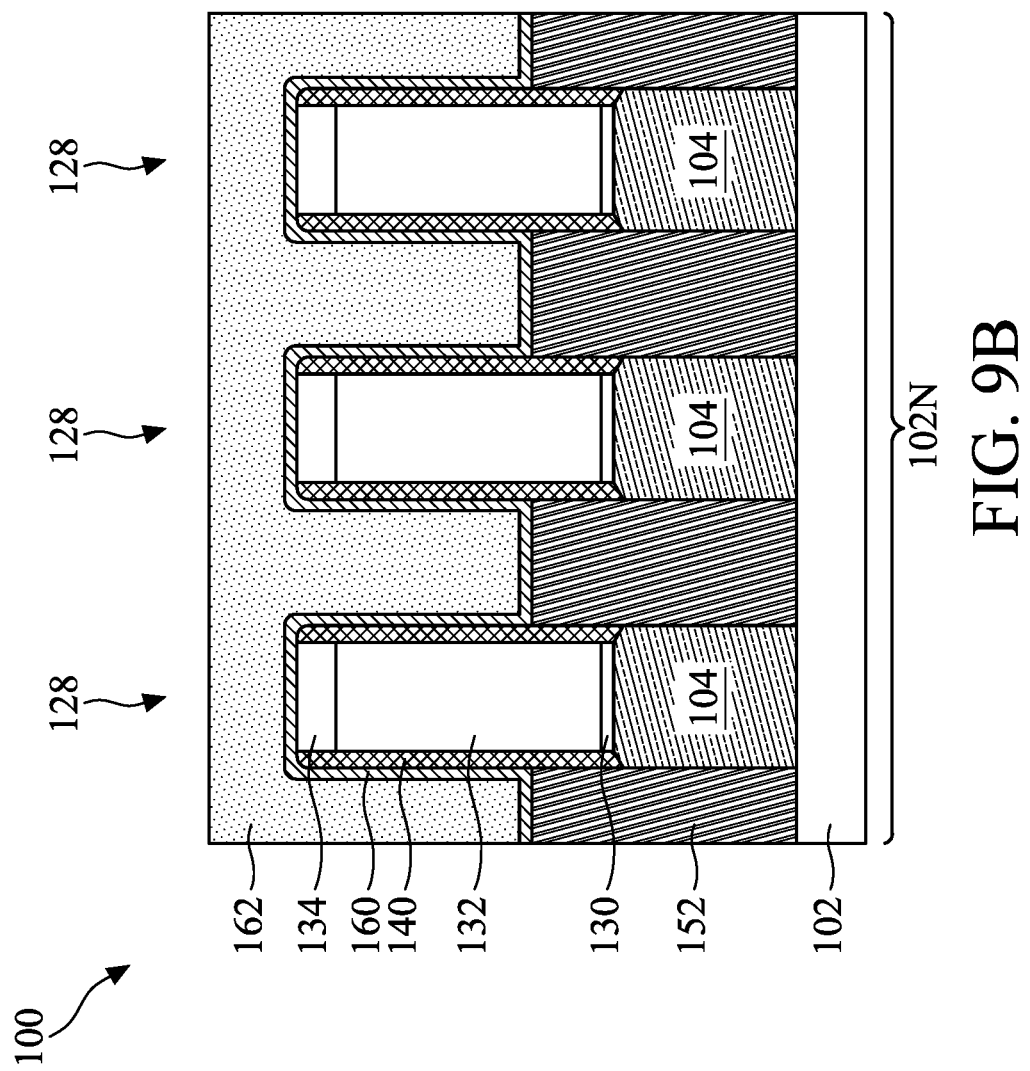
Figure 9C:
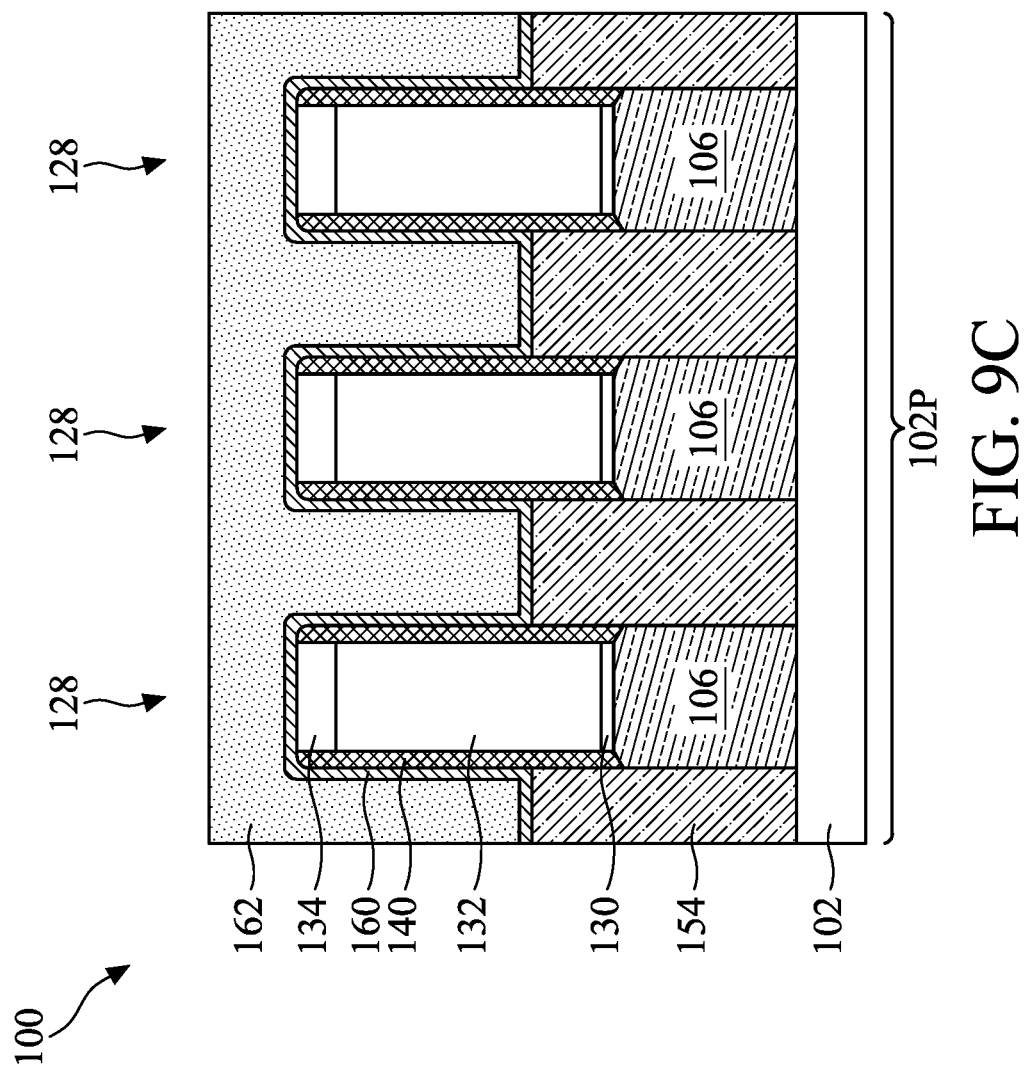

In FIGS. 9A-9C, a contact etch stop layer (CESL) 160 is conformally formed on the exposed surfaces of the semiconductor device structure 100. The CESL 160 covers the sidewalls of the sacrificial gate stacks 128, the insulating material 112, and the S/D epitaxial features 152, 154. The CESL 160 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, a first interlayer dielectric (ILD) 162 is formed on the CESL 160. The materials for the first ILD layer 162 may include compounds comprising Si, O, C, and/or H, such as tetraethylorthosilicate (TEOS) oxide, un-doped silicate glass, silicon oxide, or doped silicon oxide such as borophosphosilicate glass (BPSG), fused silica glass (FSG), phosphosilicate glass (PSG), boron doped silicon glass (BSG), and/or other suitable dielectric materials. The first ILD layer 162 may be deposited by a PECVD process or other suitable deposition technique. In some embodiments, after formation of the first ILD layer 162, the semiconductor device structure 100 may be subject to a thermal process to anneal the first ILD layer 162. After formation of the ILD 162, a planarization process is performed to expose the sacrificial gate electrode layer 132. The planarization process may be any suitable process, such as a CMP process. The planarization process removes portions of the first ILD layer 162 and the CESL 160 disposed on the sacrificial gate stacks 128. The planarization process may also remove the mask structure 134.

Figure 10A:
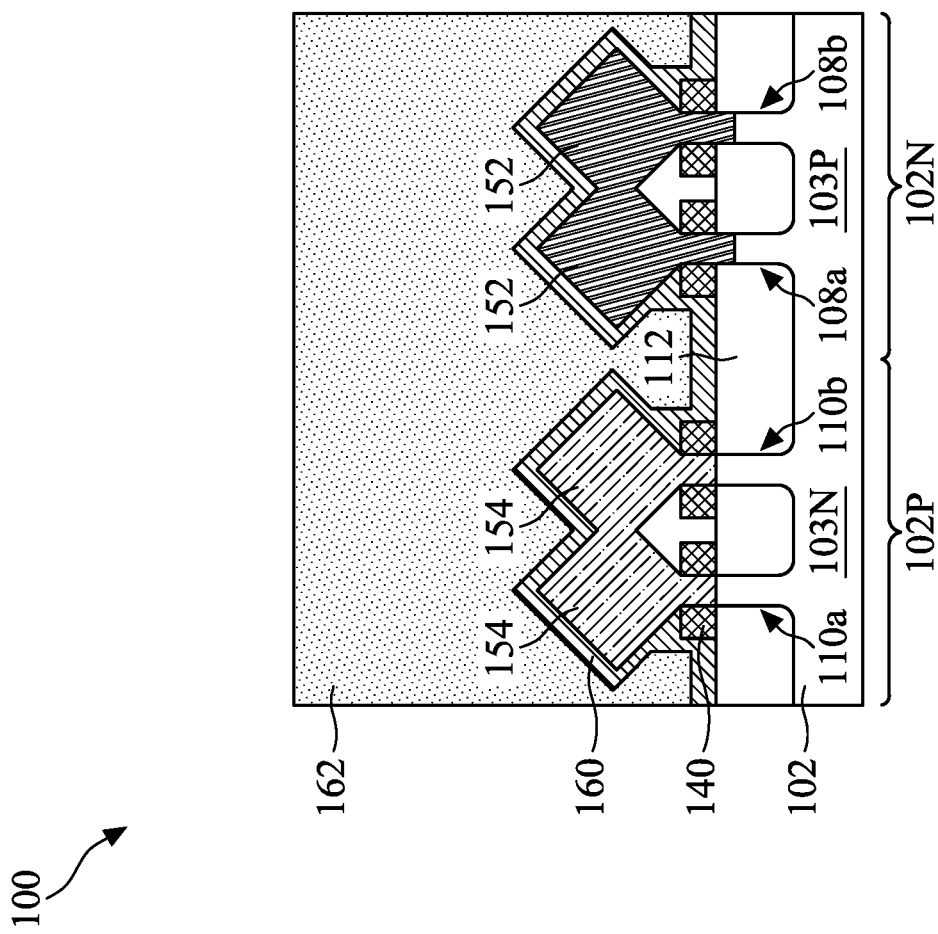
Figure 10B:
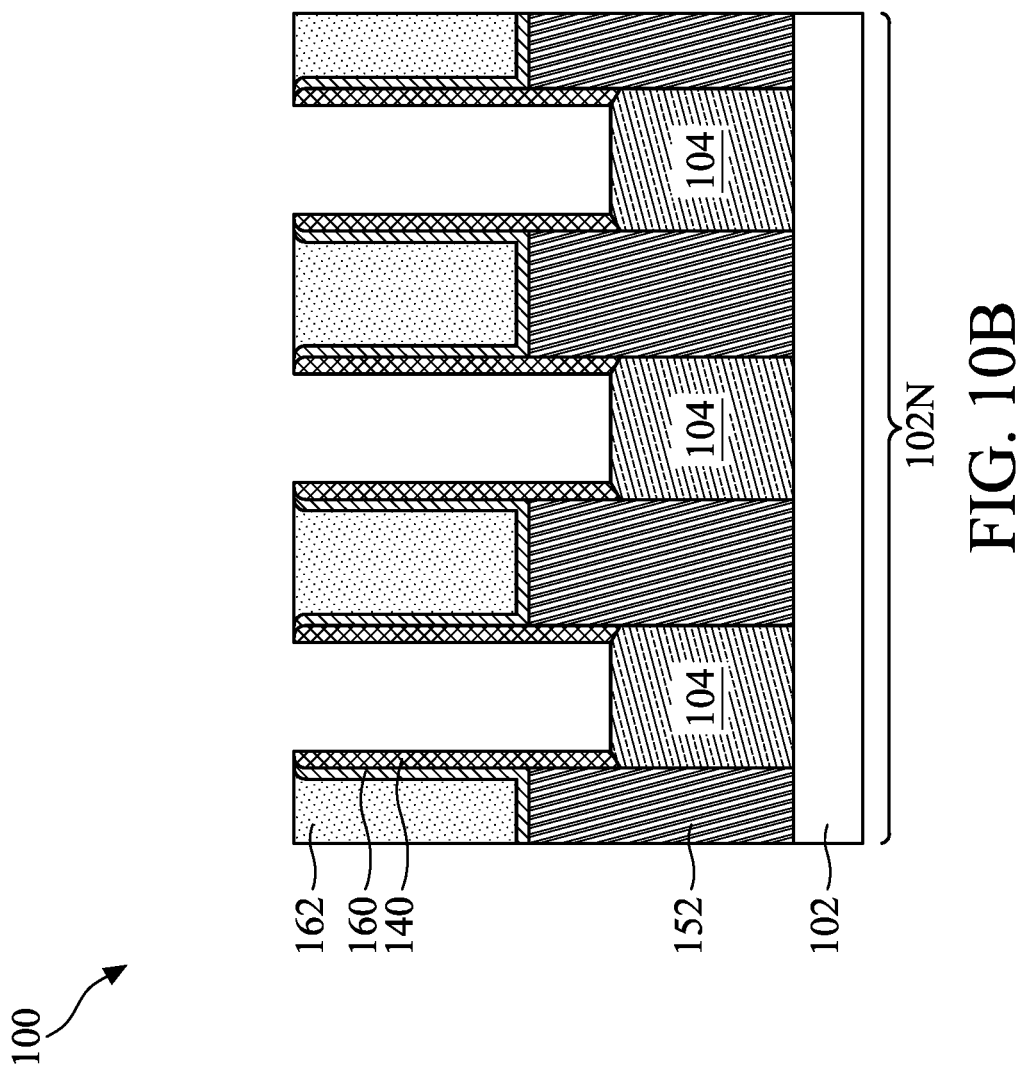
Figure 10C:
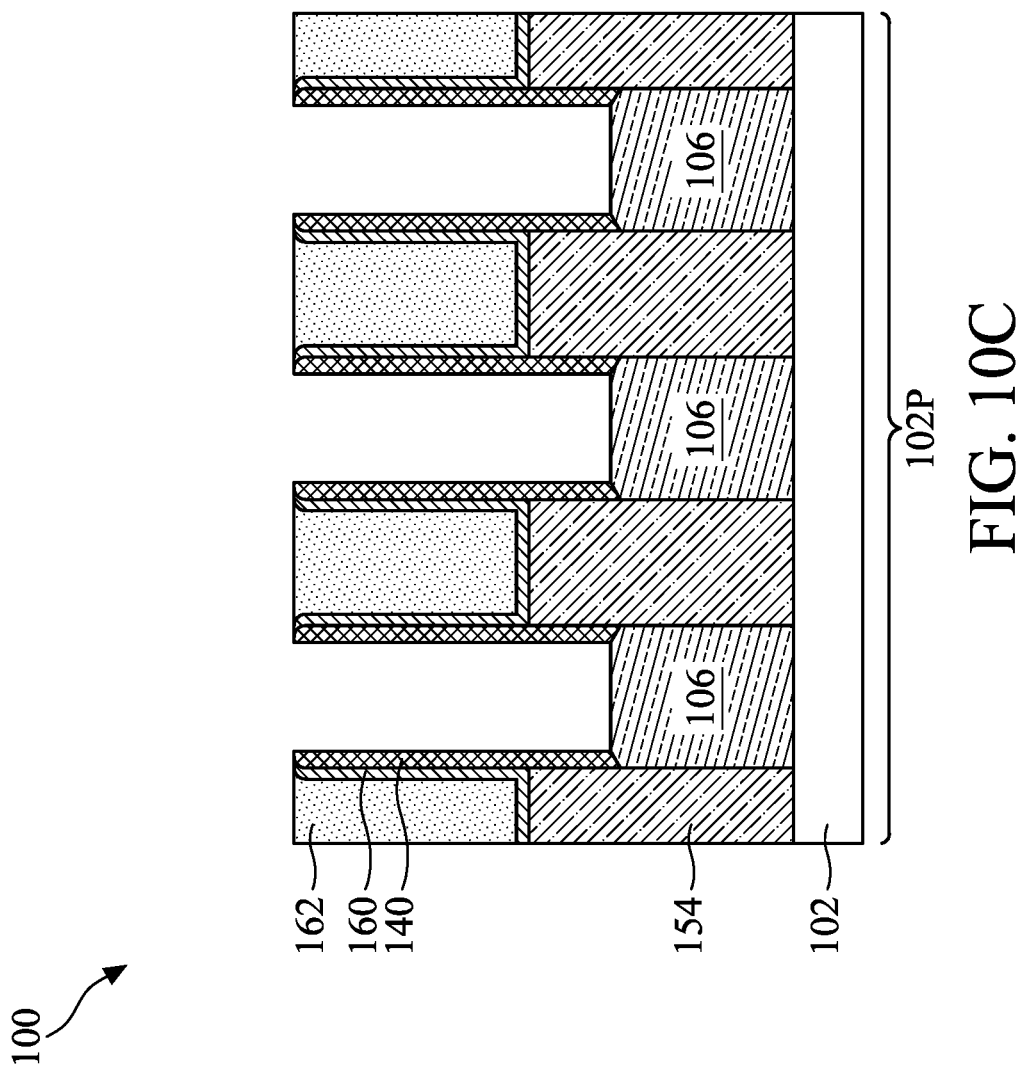

In FIGS. 10A-10C, the mask structure 134 (if not removed during CMP process), the sacrificial gate electrode layers 132 (FIG. 9B), and the sacrificial gate dielectric layers 130 (FIG. 9B) are removed. The sacrificial gate electrode layers 132 and the sacrificial gate dielectric layers 130 may be removed by one or more etch processes, such as dry etch process, wet etch process, or a combination thereof. The one or more etch processes selectively remove the sacrificial gate electrode layers 132 and the sacrificial gate dielectric layers 130 without substantially affects the spacer 140, the CESL 160, and the first ILD layer 162. The removal of the sacrificial gate electrode layers 132 and the sacrificial gate dielectric layers 130 exposes a top portion of the first and second semiconductor layers 104, 106 in the channel region.

Figure 11A:
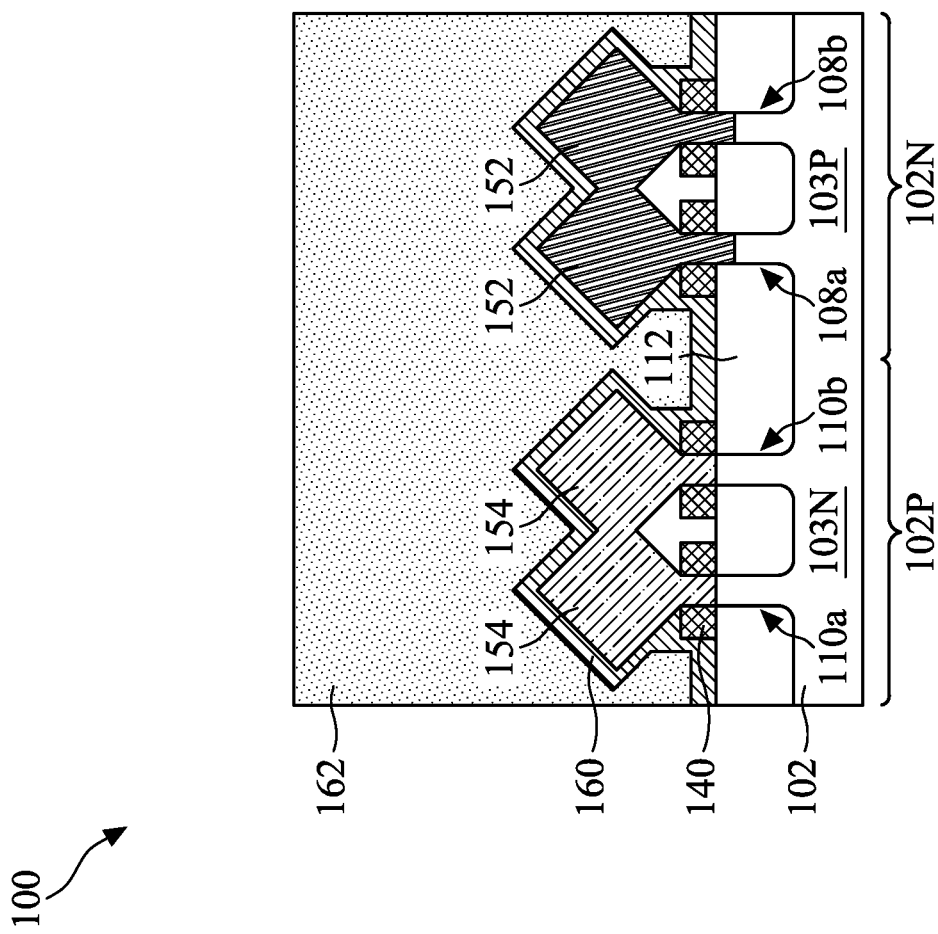
Figures 1, 11B:
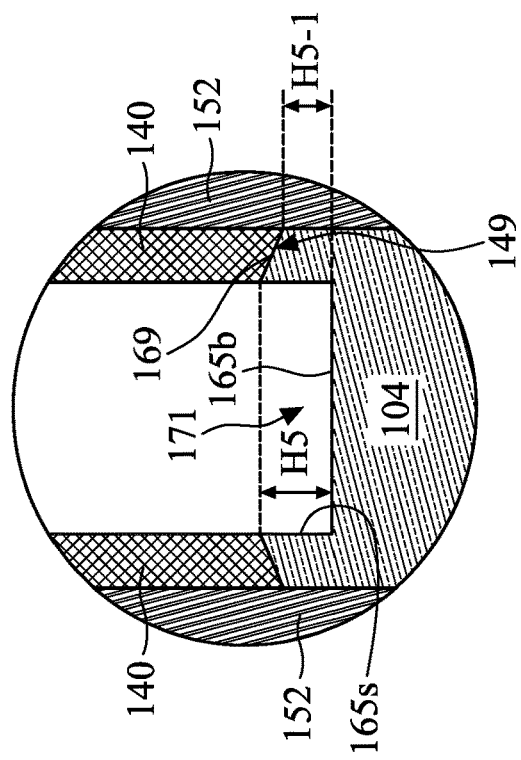
Figure 11B:
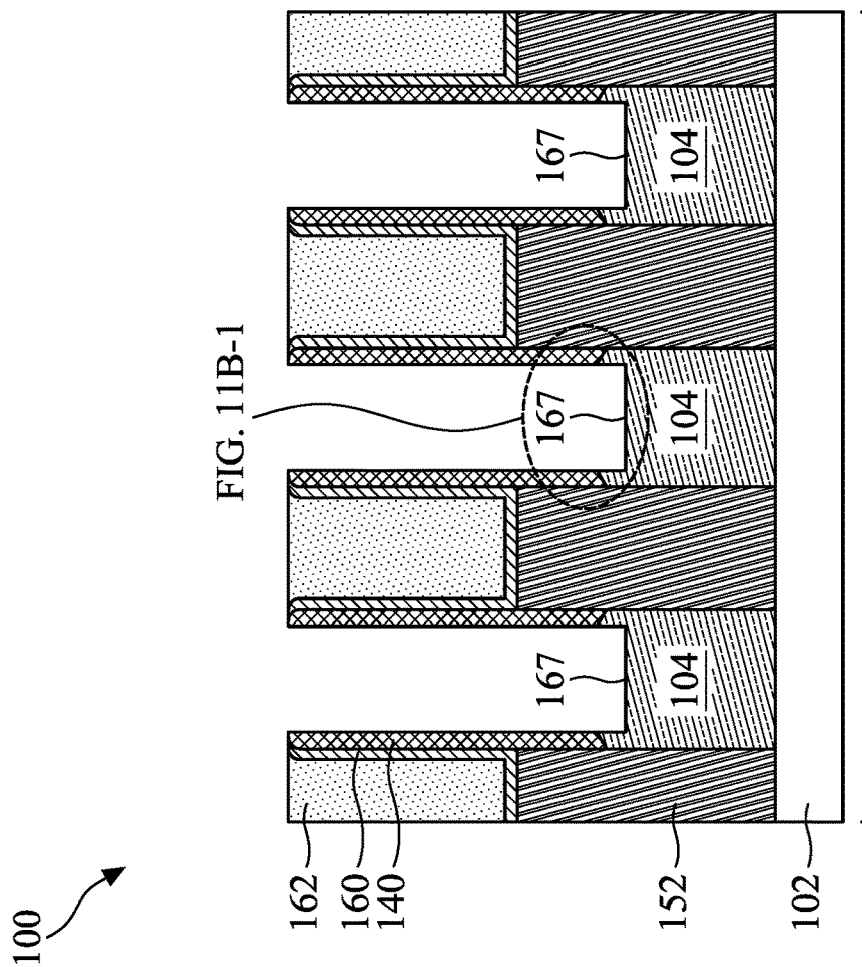

In FIGS. 11A-11C, after removing the sacrificial gate electrode layers 132 and the sacrificial gate dielectric layers 130 but prior to forming the gate dielectric layers 166 (FIG. 12B) and the gate electrode layers 168p, 168n (FIGS. 12B, 12C), the top portion of the exposed first and second semiconductor layers 104, 106 are further removed, as shown in FIGS. 11B and 11C. The removal of the portions of the first and second semiconductor layers 104, 106 provides additional surface coverage (i.e., contact area) for the subsequent gate electrode layer 168p, 168n (FIGS. 12B, 12C) and therefore, a greater gate control at the top portion of the channel regions. The removal process may be achieved by any suitable etch process, such as a dry etch process, wet etch process, or a combination thereof. The first and second semiconductor layers 104, 106 may be etched concurrently by exposing to the same etchant. The etch processes may be selective, so the spacer 140, the CESL 160, and the first ILD layer 162 are not substantially affected.

FIGS. 11B-1 is an enlarged view of a portion of the semiconductor device structure 100 showing a recess 171 (represented by dotted line) is formed in the top portion of the first semiconductor layers 104 in the channel regions as a result of the removal of the portion of the first semiconductor layer 104. The top portion of the first semiconductor layers 104 under the spacers 140 is covered and not etched. The recess 171 has a bottom surface 165b and sidewall surfaces 165s extending upwardly from the bottom surface 165b. The top portion of the first semiconductor layer 104 thus has a substantially U-shaped profile. In some embodiments, the bottom surface 165b of the recess 171 is at a level below an interface 169 defined between the spacer 140 and the first semiconductor layer 104. The interface 169 has a slope corresponding to the taper profile 149 of the top portion of the fins 108a-b, and the lowest point of the interface 169 is higher than the bottom surface 165b of the recess 171. The sidewall surface 165s (or depth) of the recess 171 has a height H5 in a range from about 2 nm to about 7 nm, such as about 3 nm to about 5 nm. In some embodiments, the lowest point of the interface 169 is at a height H5-1 of about 2 nm to about 7 nm from the bottom surface 165b. In some embodiments, the difference between the height H5 and the height H5-1 is in a range of about 1 nm to about 5 nm.

FIG. 11C-1 is an enlarged view of a portion of the semiconductor device structure 100 showing a recess 173 (represented by dotted line) is formed in the top portion of the second semiconductor layers 106 in the channel regions as a result of the removal of the portion of the second semiconductor layer 106. The top portion of the second semiconductor layers 106 under the spacers 140 is covered and not etched. Likewise, the recess 173 has a bottom surface 167b and sidewall surfaces 167s extending upwardly from the bottom surface 167b. The top portion of the second semiconductor layer 106 thus has a substantially U-shaped profile. In some embodiments, the bottom surface 167b of the recess 173 is at a level below an interface 175 defined between the spacer 140 and the second semiconductor layer 106. The interface 175 has a slope corresponding to the taper profile 149 of the top portion of the fins 110a-b, and the lowest point of the interface 175 is higher than the bottom surface 167b of the recess 173. The sidewall surface 167s (or depth) of the recess 173 has a height H6 less than the height H5. In some embodiments, the height H6 is in a range from about 1 nm to about 5 nm. In some embodiments, the lowest point of the interface 175 is at a height H6-1 of about 1 nm to about 5 nm from the bottom surface 167b. In cases where the first semiconductor layer 104 in the N-type region 102N is SiGe and the second semiconductor layer 106 in the P-type region 102P is Si, and the height H6-1 is less than the height H5-1.

The channel region at and/or near the interface 169, 175 may be a lightly doped drain (LDD) region formed as a result of lateral diffusion of dopants from the S/D epitaxial features 152, 154. In some embodiments, the S/D epitaxial features 152, 154 may have a dopant concentration of about $1 \times 20/cm^3$ to about $6 \times 21/cm^3$. The dopant concentration at the LDD region may be about 5% to about 50% of the dopant concentration in the S/D epitaxial features 152, 154. By removing portions of the exposed first and second semiconductor layers 104, 106 in the channel regions after removal of the sacrificial gate electrode layers 132 and the sacrificial gate dielectric layers 130 but prior to forming the gate dielectric layers 166 (FIG. 12B) and the gate electrode layers 168p, 168n (FIGS. 12B, 12C), additional surface coverage can be created for the subsequent gate electrode layer 168p, 168n. Since higher current is retained at upper region than the lower region of S/D epitaxial features 152, 154 due to lower contact resistance at interface between S/D contacts and the S/D epitaxial features 152, 154, and the current is normally flowed from the S/D contacts to P+ or N+ S/D epitaxial features 152, 154 and then to the channel region, higher (about 50%) ion current density is usually seen at the top portion (e.g., about 5-10 nm measuring from the highest point of the interface 169, 175) of the channel region. Therefore, providing additional surface coverage of the gate electrode layer 168n, 168p at the top portion of the channel region ensures better electrical control over the channel region in the N-type region 102N and the P-type region 102P, respectively. This is advantageous over the conventional FinFET transistor devices because the top portion of the channel regions is loss during replacement of the sacrificial gate structures and/or removal of native oxides at interfaces 169, 175 formed as a result of annealing performed to densify spacers 140. The formation of the recesses 171, 173 in the top portion of the first and second semiconductor layers 104, 106 allows the sidewall surface 165s, 167s to provide extra surface contact area for the subsequent gate electrode layers 168p, 168n to use higher ion current density and dopants at the top portion of the channel region.

If the height H5 is less than about 2 nm and the height H6 is less than about 1 nm, the benefit of greater gate control over the top portion of the channel region is diminished. On the other hand, if the height H5 is greater than about 7 nm and the height H6 is greater than about 5 nm, the manufacturing cost is increased without significant advantage. In addition, since the first and second semiconductor layers 104, 106 are etched at different rates, the height H6 of the recess 173 may be different than the height H5 of the recess 171. In cases where the first semiconductor layer 104 in the N-type region 102N is SiGe and the second semiconductor layer 106 in the P-type region 102P is Si, the height H5 is greater than the height H6, and the difference between the height H5 and the height H6 can be in a range between about 1 nm and about 5 nm.

Figure 12A:
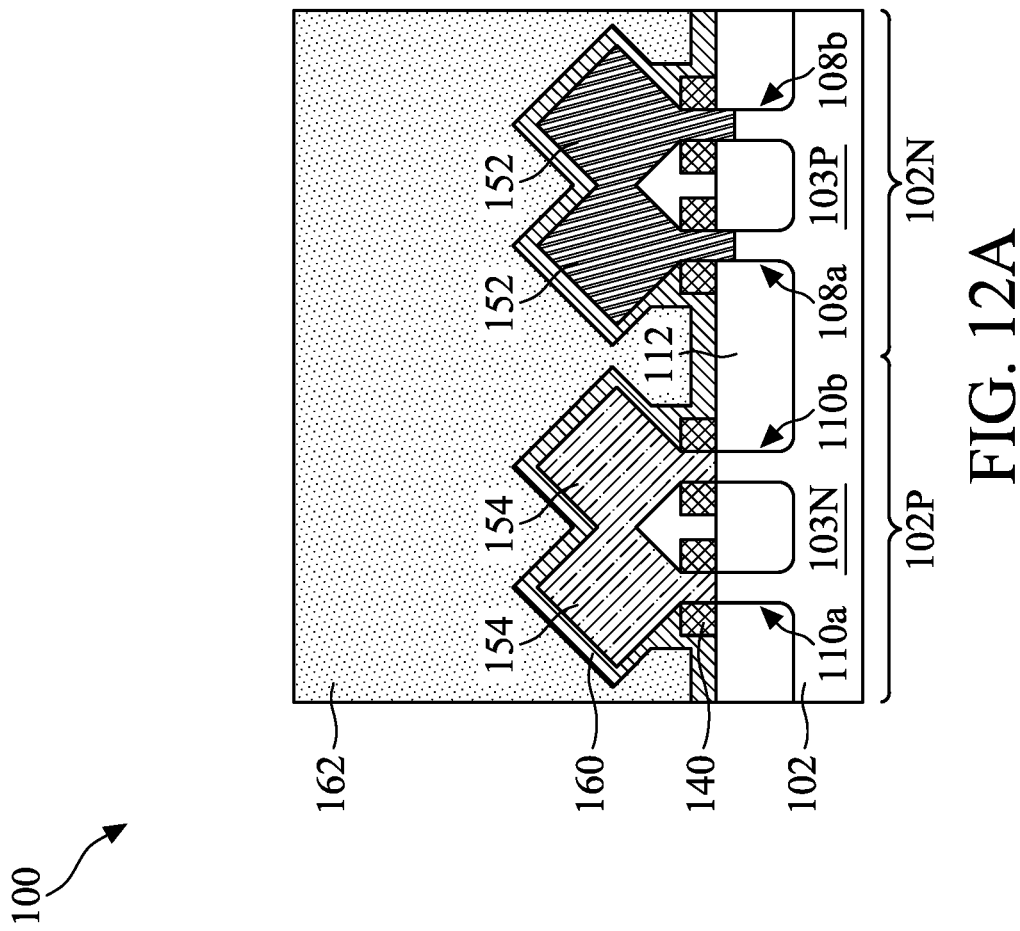

In FIGS. 12A-12C, replacement gate structures 177 are formed. The replacement gate structure 177 may include a gate dielectric layer 166 and a gate electrode layer 168p, 168n formed on the gate dielectric layer 166. As can be seen in FIGS. 12B and 12C, the gate dielectric layer 166 is formed on the first and second semiconductor layers 104, 106. Portions of the gate dielectric layer 166 are in contact with the spacer 140 and the bottom surfaces 165b, 167b and the sidewall surfaces 165s, 167s of the recesses 171 (FIG. 11B-1), 173 (FIG. 11C-1), respectively. In various embodiments, an interface 180 defined between the gate dielectric layer 166 and the first semiconductor layer 104 is at a level lower than the interface 169. Particularly, the recess 171 (FIG. 11B-1) formed in the top portion of the first semiconductor layer 104 results in a portion of the first semiconductor layer 104 (i.e., channel region) located between and in contact with the gate dielectric layer 166 and the S/D epitaxial feature 152, with the highest point of the interface 169 being adjacent to the gate electrode layer 168 and the lowest point of the interface 169 being adjacent to the S/D epitaxial features 152, as shown in FIG. 12B-1. Likewise, an interface 182 defined between the gate dielectric layer 166 and the second semiconductor layer 106 is at a level lower than the interface 175. The recess 173 (FIG. 11C-1) formed in the top portion of the second semiconductor layer 106 results in a portion of the second semiconductor layer 106 located between and in contact with the gate dielectric layer 166 and the S/D epitaxial feature 154, with the highest point of the interface 175 being adjacent to the gate electrode layer 168 and the lowest point of the interface 175 being adjacent to the S/D epitaxial features 154, as shown in FIG. 12C-1.

The gate dielectric layer 166 may include one or more dielectric layers and may include the same material(s) as the sacrificial gate dielectric layer 130. In some embodiments, the gate dielectric layers 166 may be deposited by one or more ALD processes or other suitable processes. The gate electrode layer 168p, 186n may include one or more layers of electrically conductive material, such as polysilicon, aluminum, copper, titanium, tantalum, tungsten, cobalt, molybdenum, tantalum nitride, nickel silicide, cobalt silicide, TiN, WN, AlTi, AlTiO, AltiC, AlTiN, TaCN, TaC, TaSiN, metal alloys, other suitable materials, and/or combinations thereof. For devices in the N-type region 102N, the gate electrode layer 168n may be AlTiO, AlTiC, or a combination thereof. For devices in the P-type region 102P, the gate electrode layer 168p may be AlTiO, AlTiC, AlTiN, or a combination thereof. The gate electrode layers 168 may be formed by PVD, CVD, ALD, electro-plating, or other suitable method.

Optionally, a metal gate etching back (MGEB) process is performed to remove portions of the gate dielectric layer 166 and the gate electrode layer 168p, 168n. The MGEB process may be a plasma etching process employing one or more etchants such as chlorine-containing gas, a bromine-containing gas, and/or a fluorine-containing gas. After the MGEB process, a top surface of the gate electrode layer 168p, 168n may be lower than a top surface of the gate dielectric layer 166. In some embodiments, portions of the spacers 140 are etched back so that the top surface of the spacers 140 is higher than the top surfaces of the gate dielectric layer 166 and the gate electrode layer 168p, 168n. Then, trenches formed above the gate dielectric layer 166 and the gate electrode layer 168p, 168n as a result of the MGEB processes are filled with a self-aligned contact (SAC) layer 179. The SAC layer 179 can be formed of any dielectric material that has different etch selectivity than the CESL 160 and serves as an etch stop layer during subsequent trench and via patterning for metal contacts. A CMP process is then performed to remove excess deposition of the SAC layer 179 until the top surface of the first ILD layer 162 is exposed.

Figure 13A:
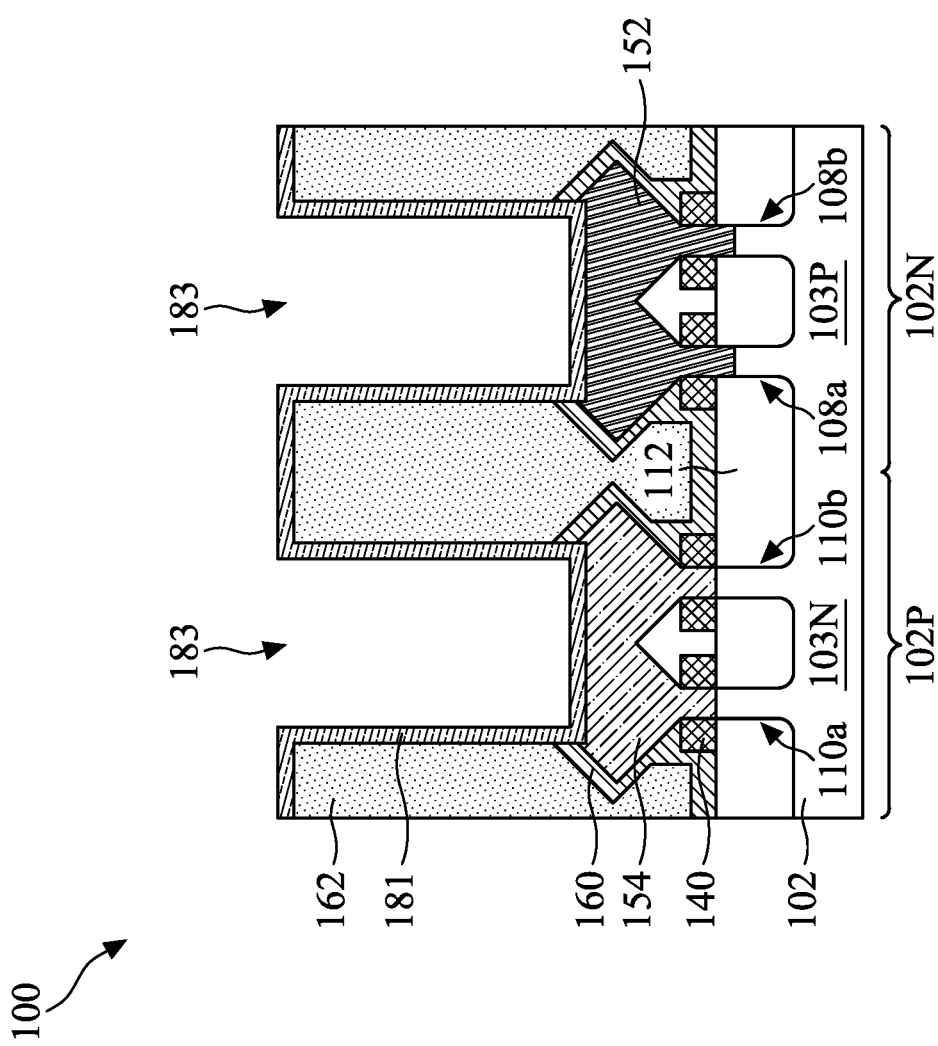
Figure 13B:
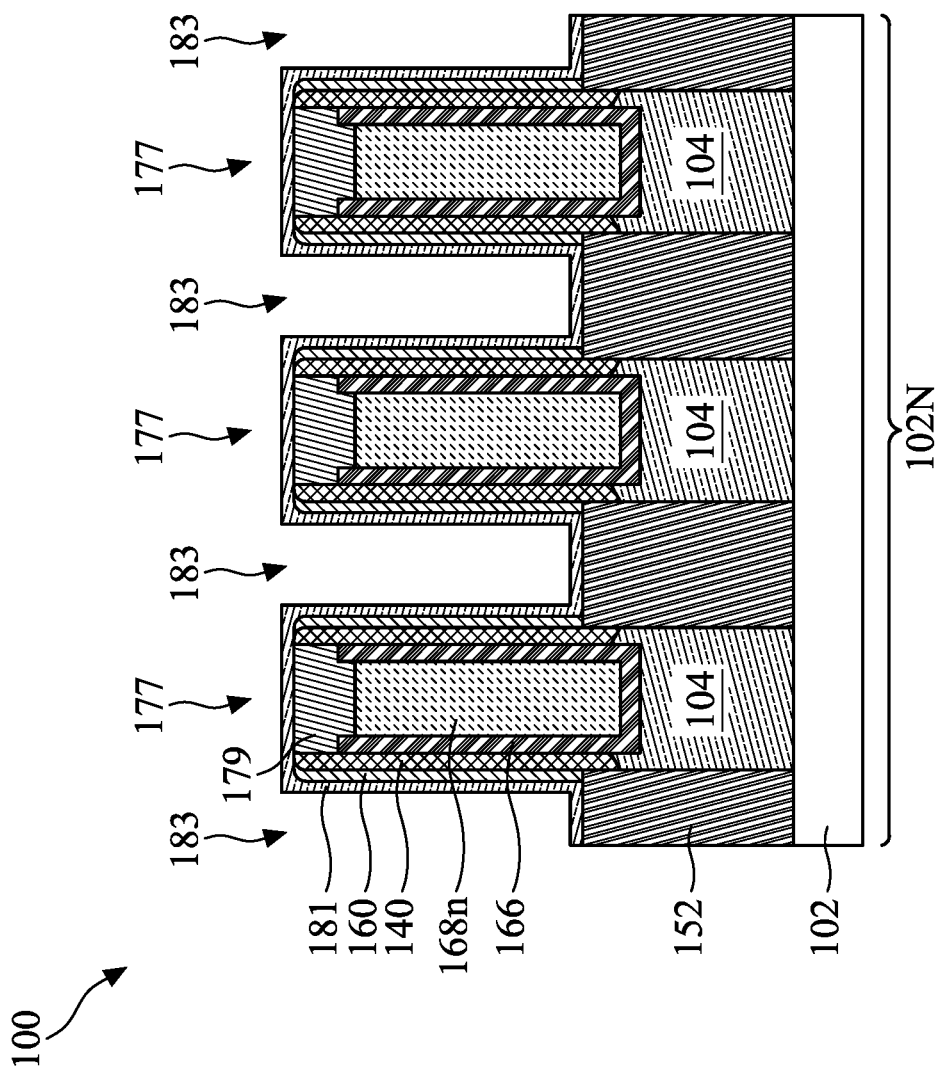
Figure 13C:
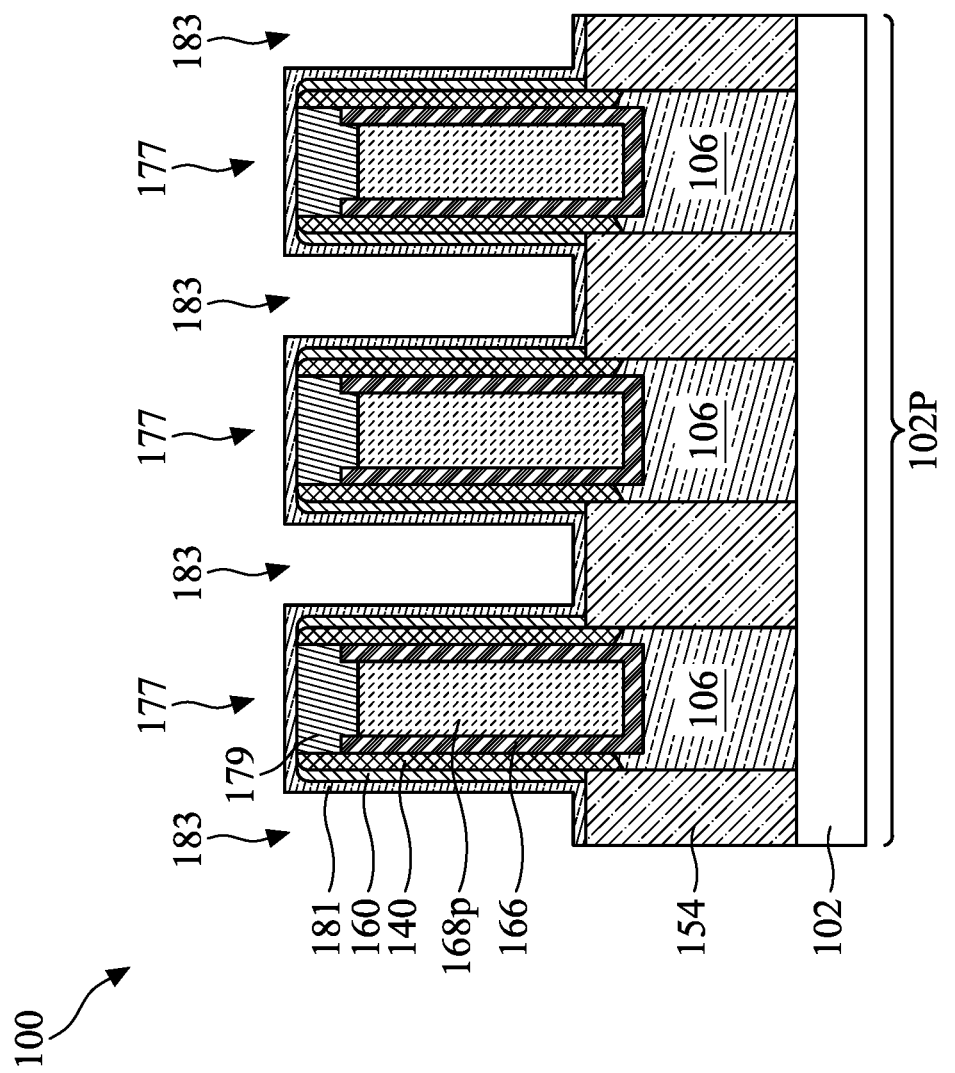
Figure 13D:
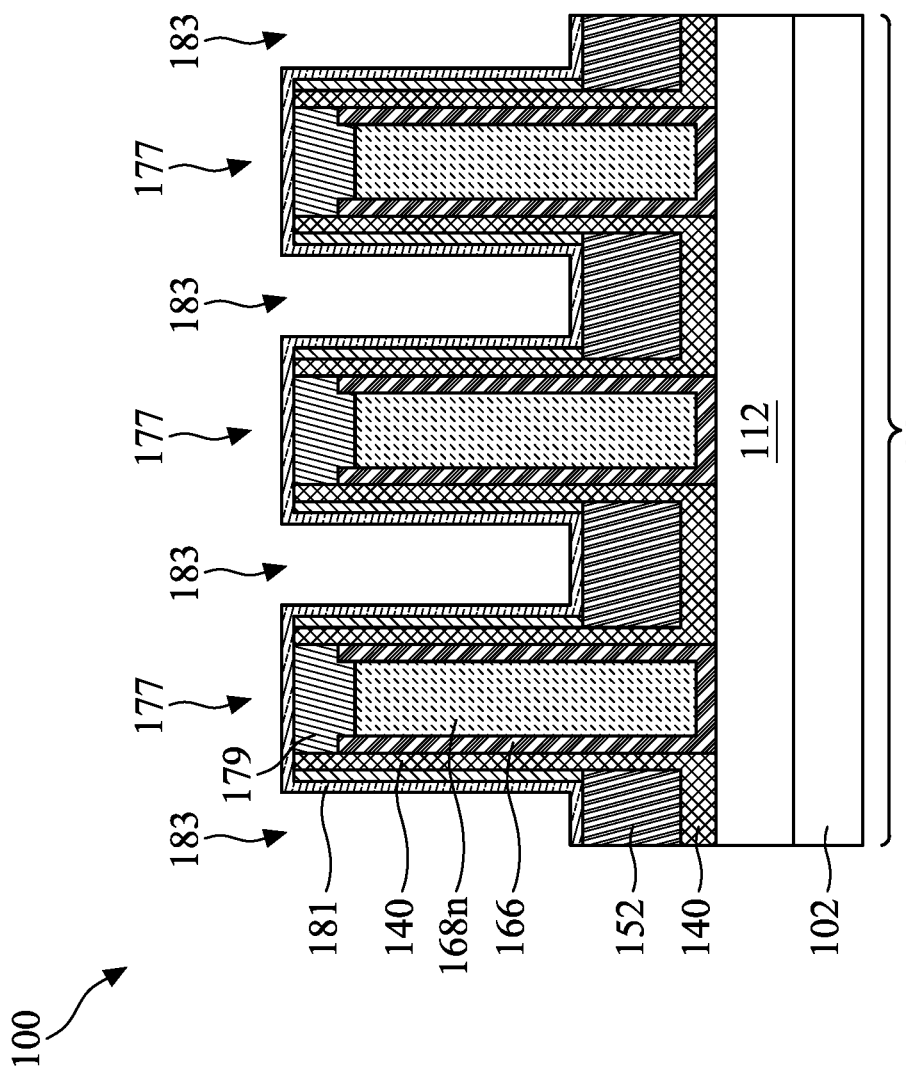

In FIGS. 13A-13C, portions of the first ILD layer 162 and the CESL 160 disposed on both sides of the replacement gate structures 177 are removed. The removal of the portions of the first ILD layer 162 and the CESL 160 forms a contact opening 183 exposing the S/D epitaxial features 152, 154, respectively. In some embodiments, the upper portion of the exposed S/D epitaxial features 152, 154 is removed. Next, a contact sidewall dielectric layer 181 is conformally formed on the semiconductor device structure 100. The contact sidewall dielectric layer 181 serves to isolate subsequently formed S/D contacts (e.g., conductive features 172 as shown in FIGS. 14A-14D) from nearby layers while preserving integrity of the S/D contacts. The contact sidewall dielectric layer 181 is formed on top surfaces of the sacrificial gate stacks 128 (or SAC layer 179 if used) and the CESL 160. The contact sidewall dielectric layer 181 is also formed in each contact opening 183 and in contact with the S/D epitaxial features 152, 154 in the N-type region 102N and the P-type region 102P, respectively. FIGS. 13D-15D illustrate cross-sectional side views of various stages of manufacturing the semiconductor device structure 100 of FIG. 4 taken along line D-D, in accordance with some embodiments. Line D-D corresponds to line D-D shown in a schematic layout 1600 of FIG. 16. In some embodiments, the contact sidewall dielectric layer 181 includes a material having a k value greater than 7. In some embodiments, the contact sidewall dielectric layer 181 includes a material having a k value greater than the spacer 140. Suitable materials for the contact sidewall dielectric layer 181 may include, but are not limited to, $Si_3N_4$, SiON, SiCN, SiOCN, $AlSi_xO_y$, $Al_2O_3$, or the like. Other suitable high-k materials, such as hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), zirconium oxide (ZrO), zirconium silicon oxide (ZrSiO), titanium oxide (TiO), tantalum oxide ($Ta_2O_5$), yttrium oxide (Y$_2$O$_3$), may also be used. The contact sidewall dielectric layer 181 may be a single dielectric layer or multiple dielectric layers formed of materials discussed herein. In some examples, the contact sidewall dielectric layer 181 may include a first layer having a first k value, and a second layer having a second k value greater or lower than the first k value. The contact sidewall dielectric layer 181 may have a thickness of about 1 nm to about 4 nm and may be formed by ALD or any suitable processes.

In FIGS. 14A-14D, after formation of the contact sidewall dielectric layer 181, an anisotropic etch is performed on the contact sidewall dielectric layer 181 using, for example, RIE. During the anisotropic etch process, most of the contact sidewall dielectric layer 181 is removed from horizontal surfaces, such as top surfaces of the SAC layer 179, the spacer 140, the CESL 160, and the S/D epitaxial features 152, 154, leaving the contact sidewall dielectric layer 181 on the vertical surfaces, such as on opposite sidewalls of the replacement gate structures 177. After the anisotropic etch process, the S/D epitaxial features 152, 154 are exposed. In some embodiments, a portion of the contact sidewall dielectric layer 181 may remain in contact with the S/D epitaxial features 152, 154.

A conductive feature 172 (i.e., S/D contacts) is then formed in the contact openings 183 (FIGS. 13B-13D) over the S/D epitaxial features 152, 154. Particularly, the sidewalls of the conductive feature 172 is fully surrounded and in contact with the contact sidewall dielectric layer 181. The contact sidewall dielectric layer 181 preserves the integrity of the S/D contacts while isolating the S/D contacts from nearby layers. The conductive feature 172 may include an electrically conductive material, such as one or more of Ru, Mo, Co, Ni. W, Ti, Ta, Cu, Al, TiN and TaN. The conductive feature 172 may be formed by any suitable process, such as PVD, CVD, ALD, electro-plating, or other suitable method. A silicide layer 170 may be formed between each S/D epitaxial feature 152, 154 and the conductive feature 172, as shown in FIGS. 14A-14D. The silicide layer 170 conductively couples the S/D epitaxial features 152, 154 to the conductive feature 172. The silicide layer 170 is a metal or metal alloy silicide, and the metal includes a noble metal, a refractory metal, a rare earth metal, alloys thereof, or combinations thereof. For n-channel FETs, the silicide layer 170 may include one or more of TiSi, CrSi, TaSi, MoSi, ZrSi, HfSi, ScSi, Ysi, HoSi, TbSI, GdSi, LuSi, DySi, ErSi, YbSi, or combinations thereof. For p-channel FETs, the silicide layer 170 may include one or more of NiSi, CoSi, MnSi, Wsi, FeSi, RhSi, PdSi, RuSi, PtSi, IrSi, OsSi, or combinations thereof. Once the conductive features 172 are formed, a planarization process, such as CMP, is performed on the semiconductor device structure 100 until the top surface of the SAC layer 179 (if used) is exposed.

Figure 14A:
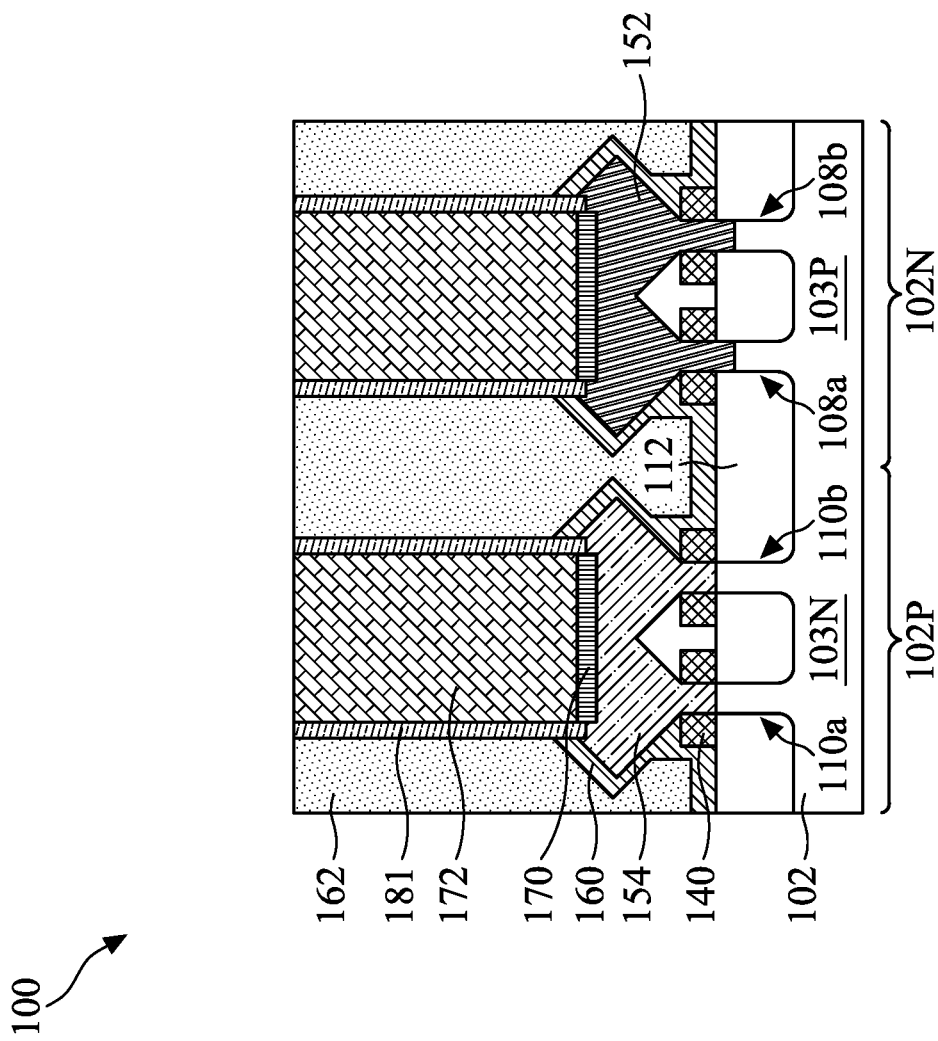
Figure 14B:
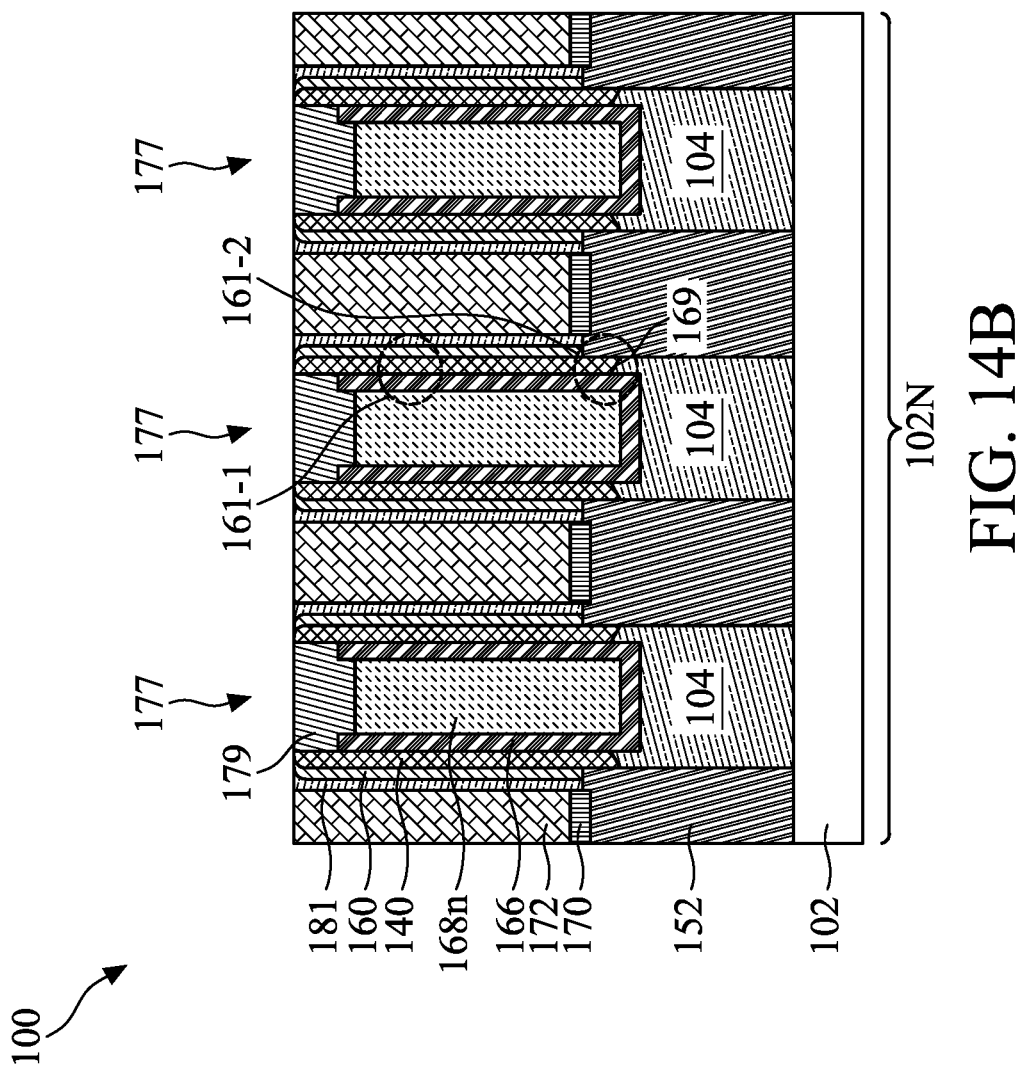
Figure 14C:
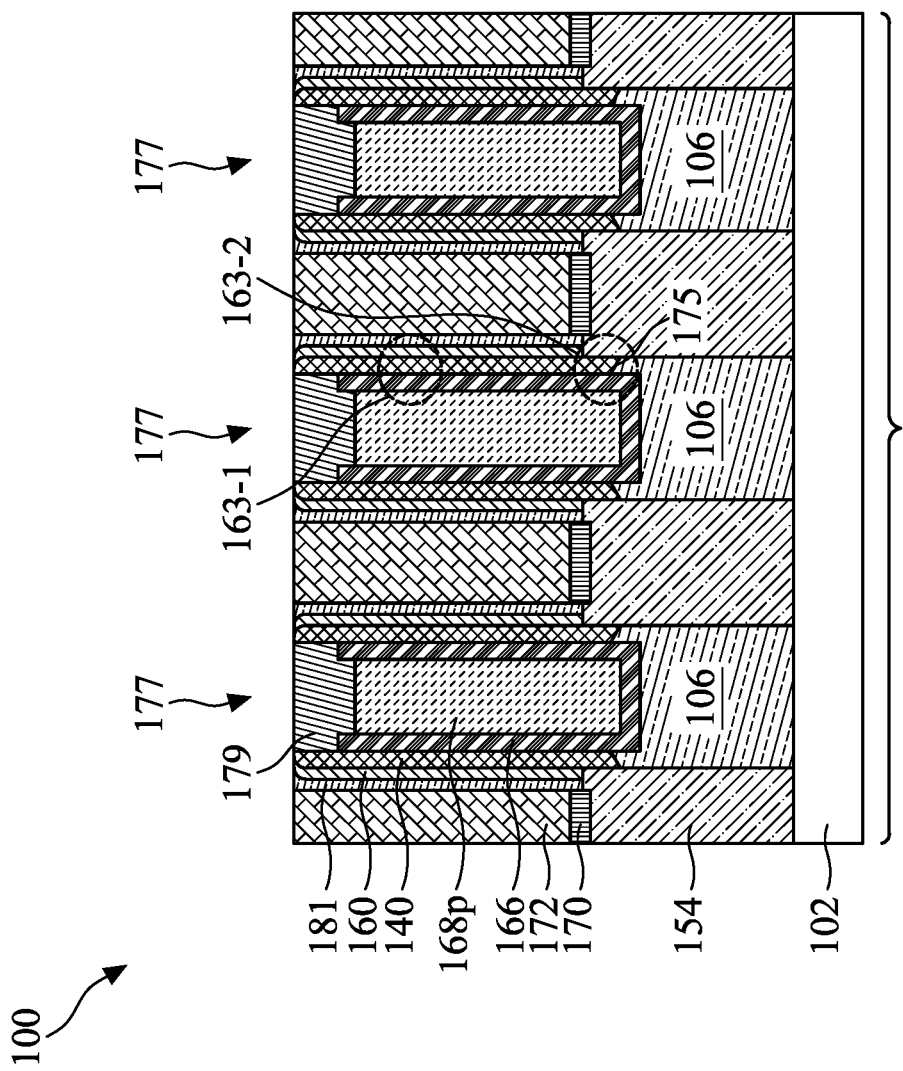
Figure 14D:
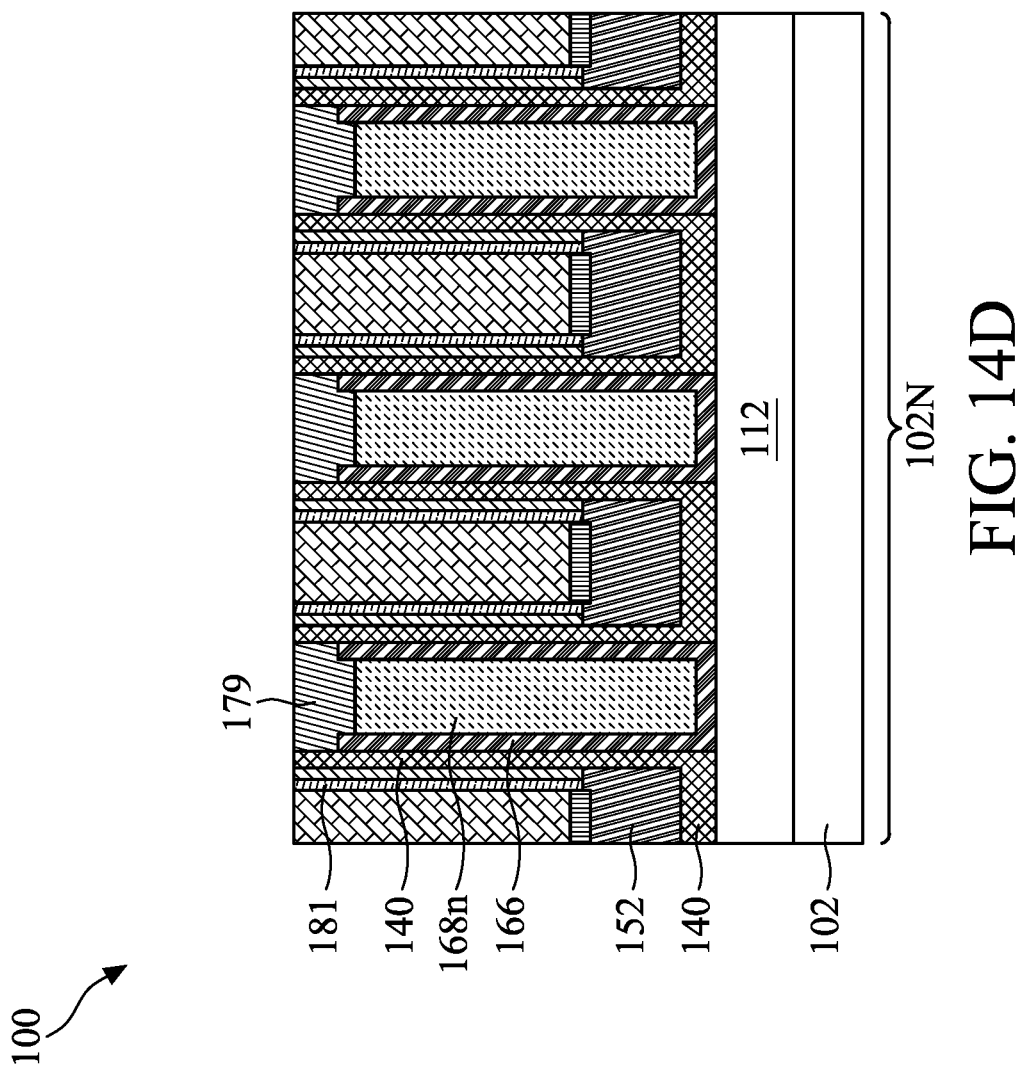

As can be seen in FIG. 14B, a first portion of the spacer 140 (e.g., portion highlighted by a dotted circle 161-1) is disposed between and in contact with the CESL 160 and the replacement gate structure 177 (e.g., gate dielectric layer 166) and a second portion of the spacer 140 (e.g., portion highlighted by a dotted circuit 161-2) is disposed between and in contact with the S/D epitaxial feature 152 and the replacement gate structure 177 (e.g., gate dielectric layer 166). A bottom of the spacer 140, which defines the interface 169 between the spacer 140 and the first semiconductor layer 104, has a slope gradually decreasing in height from the replacement gate structure 177 to the S/D epitaxial feature 152. Likewise, FIG. 14C also shows a first portion of the spacer 140 (e.g., portion highlighted by a dotted circle 163-1) is disposed between and in contact with the CESL 160 and the replacement gate structure 177 (e.g., gate dielectric layer 166) and a second portion of the spacer 140 (e.g., portion highlighted by a dotted circuit 163-2) is disposed between and in contact with the S/D epitaxial feature 154 and the replacement gate structure 177 (e.g., gate dielectric layer 166). A bottom of the spacer 140, which defines the interface 175 between the spacer 140 and the second semiconductor layer 106, has a slope gradually decreasing in height from the replacement gate structure 177 towards the S/D epitaxial feature 154.

Figure 15A:
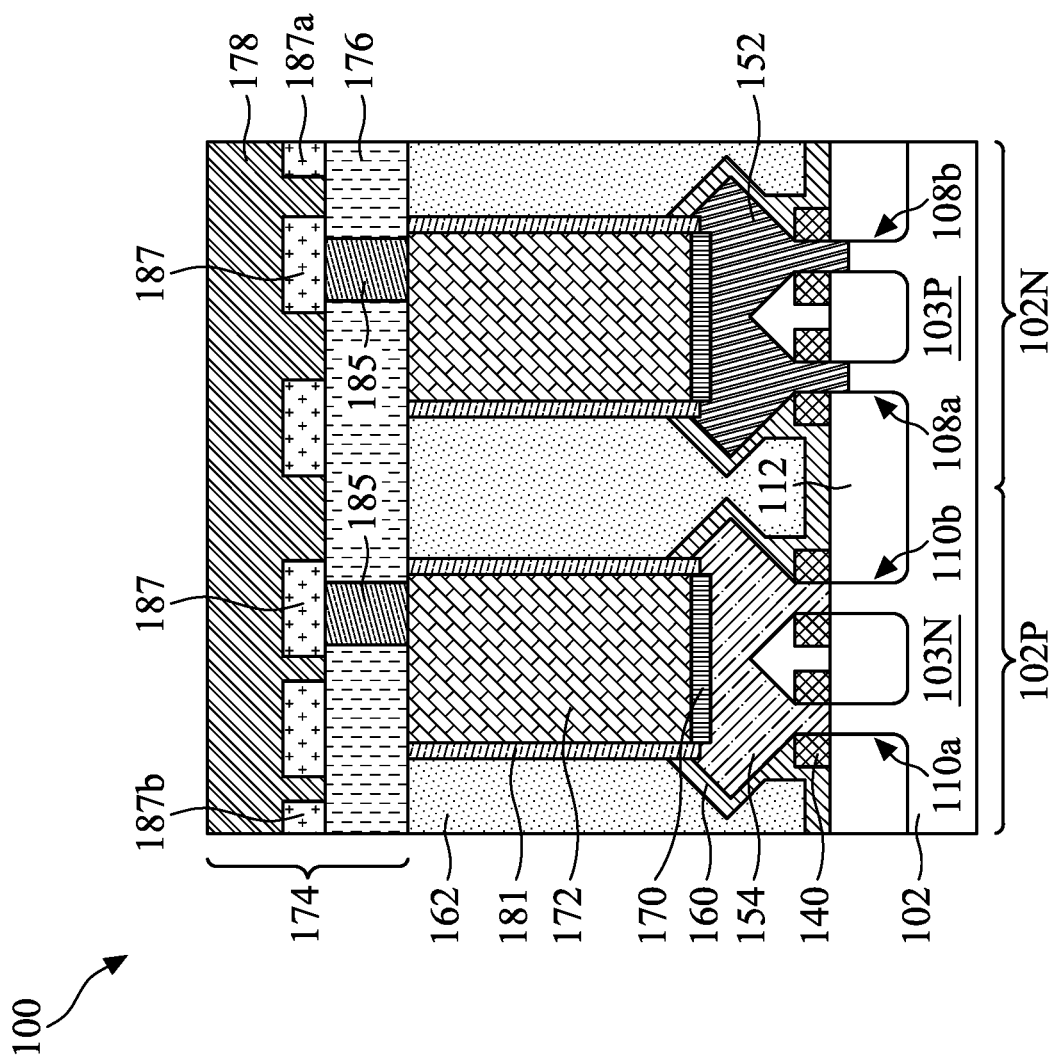
Figure 15B:
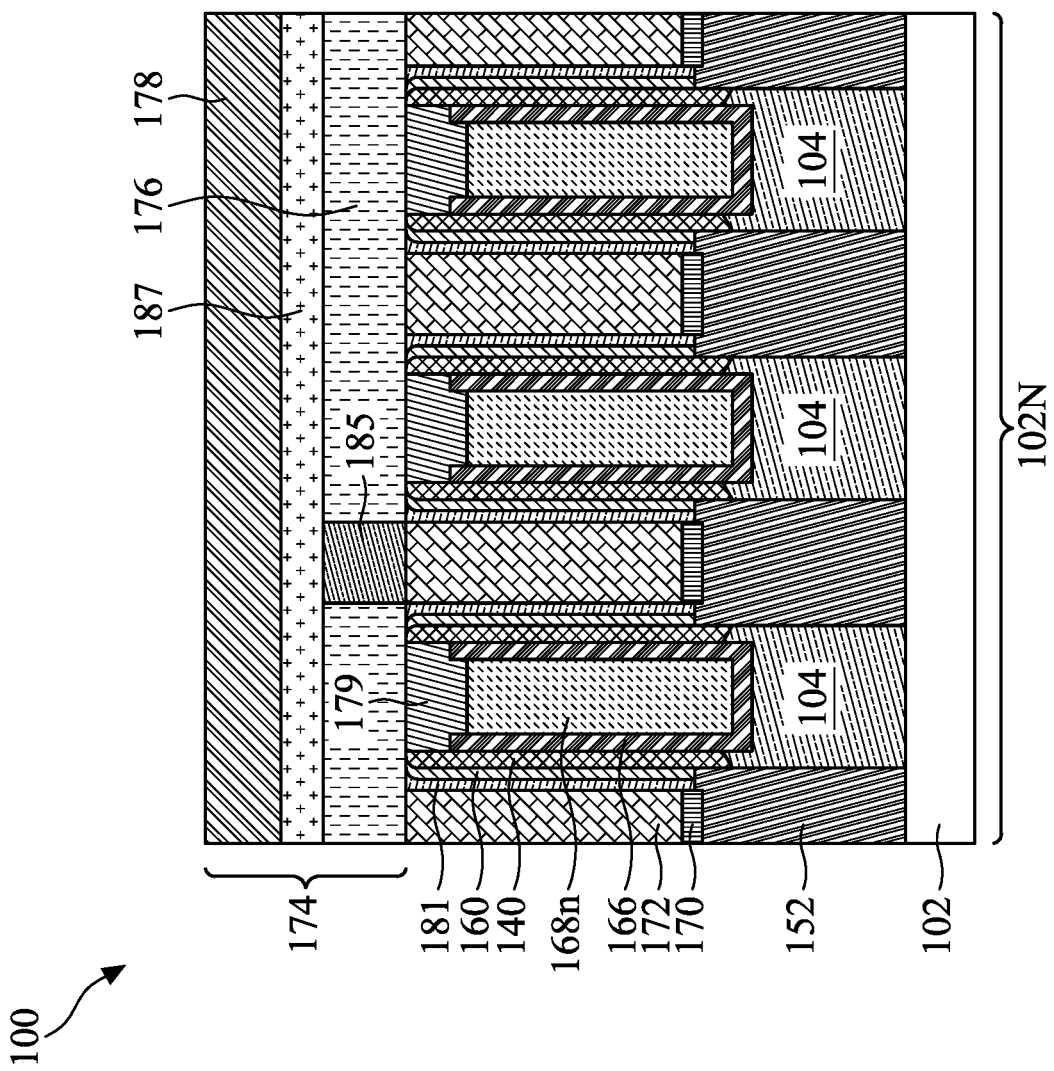
Figure 15C:
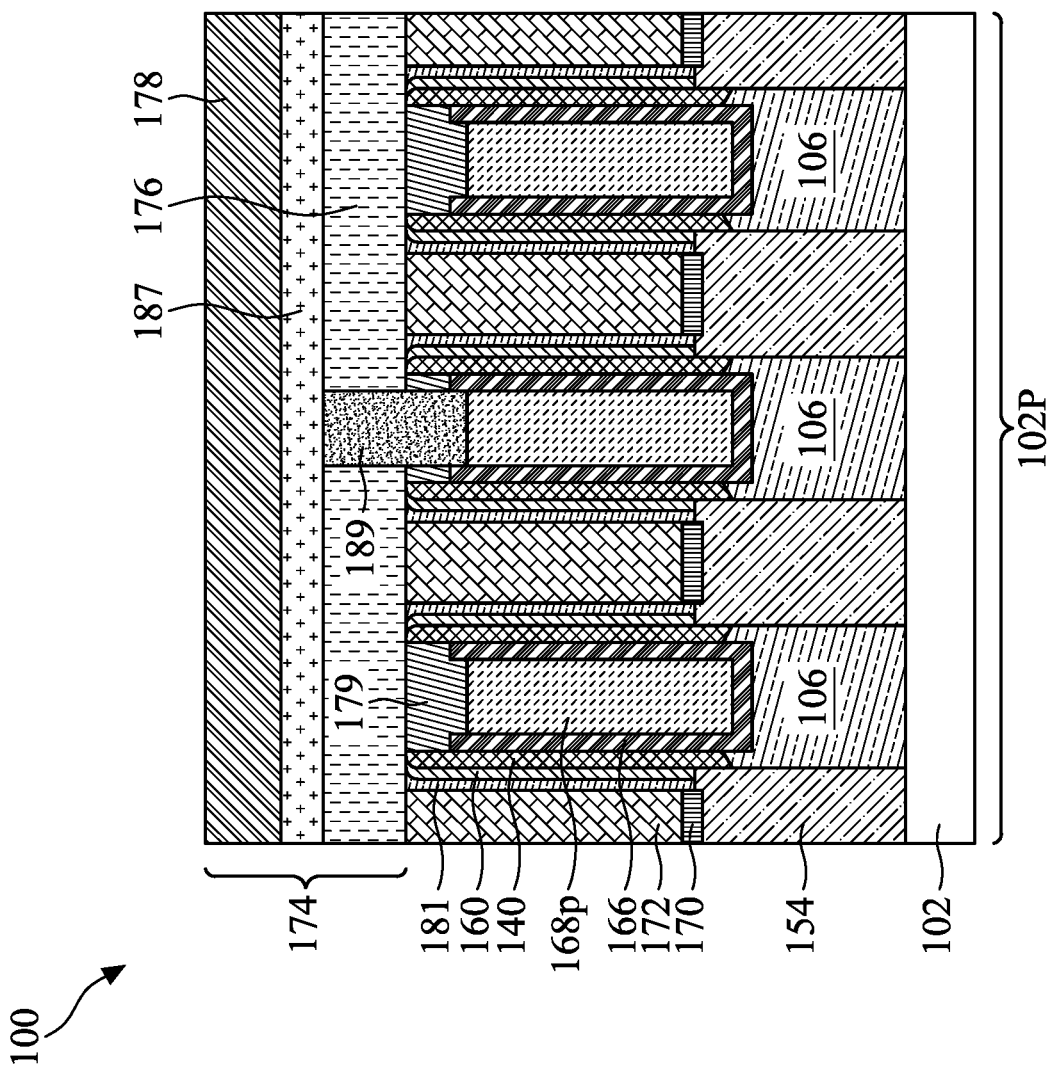
Figure 15D:
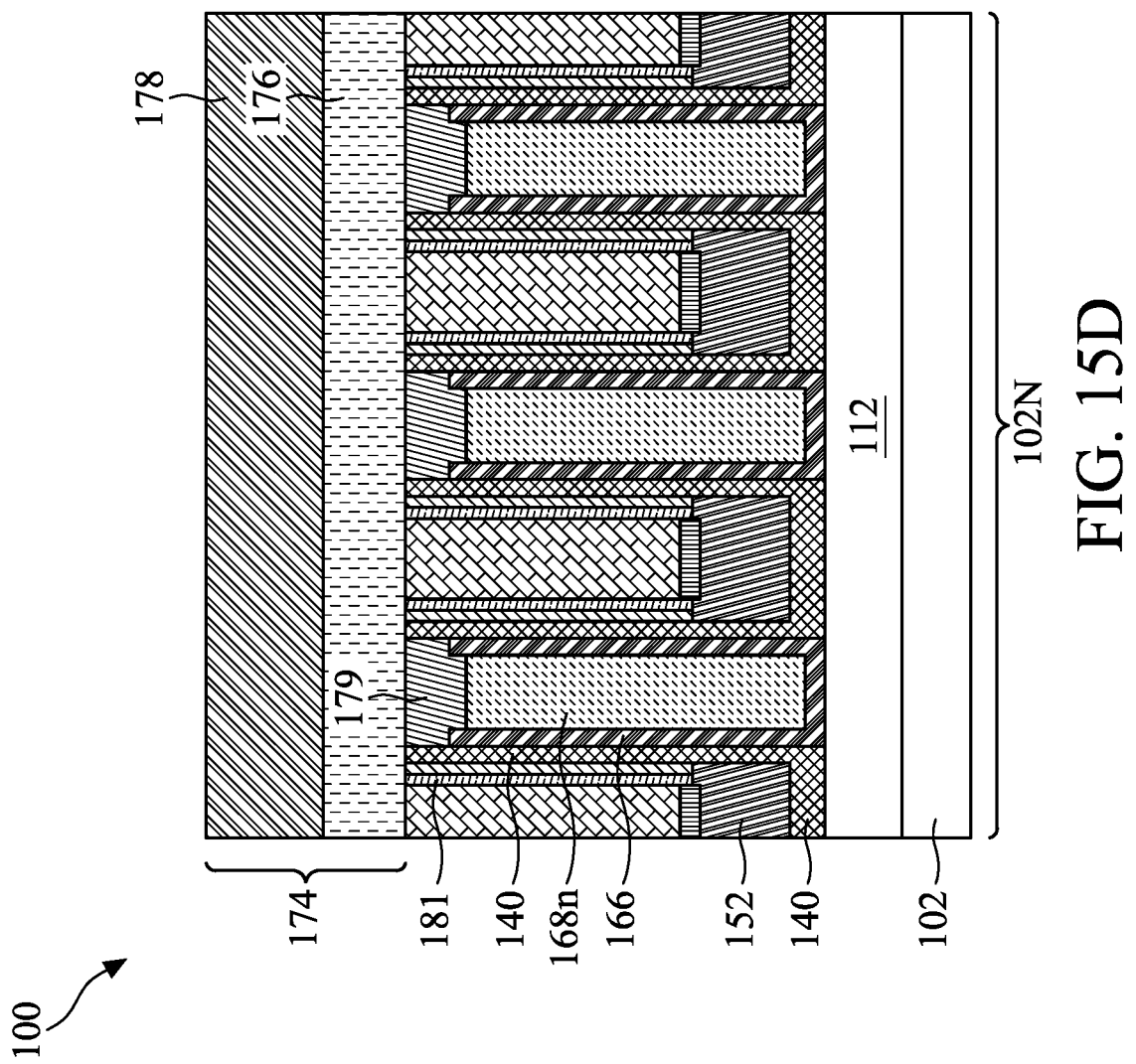
Figure 15E:
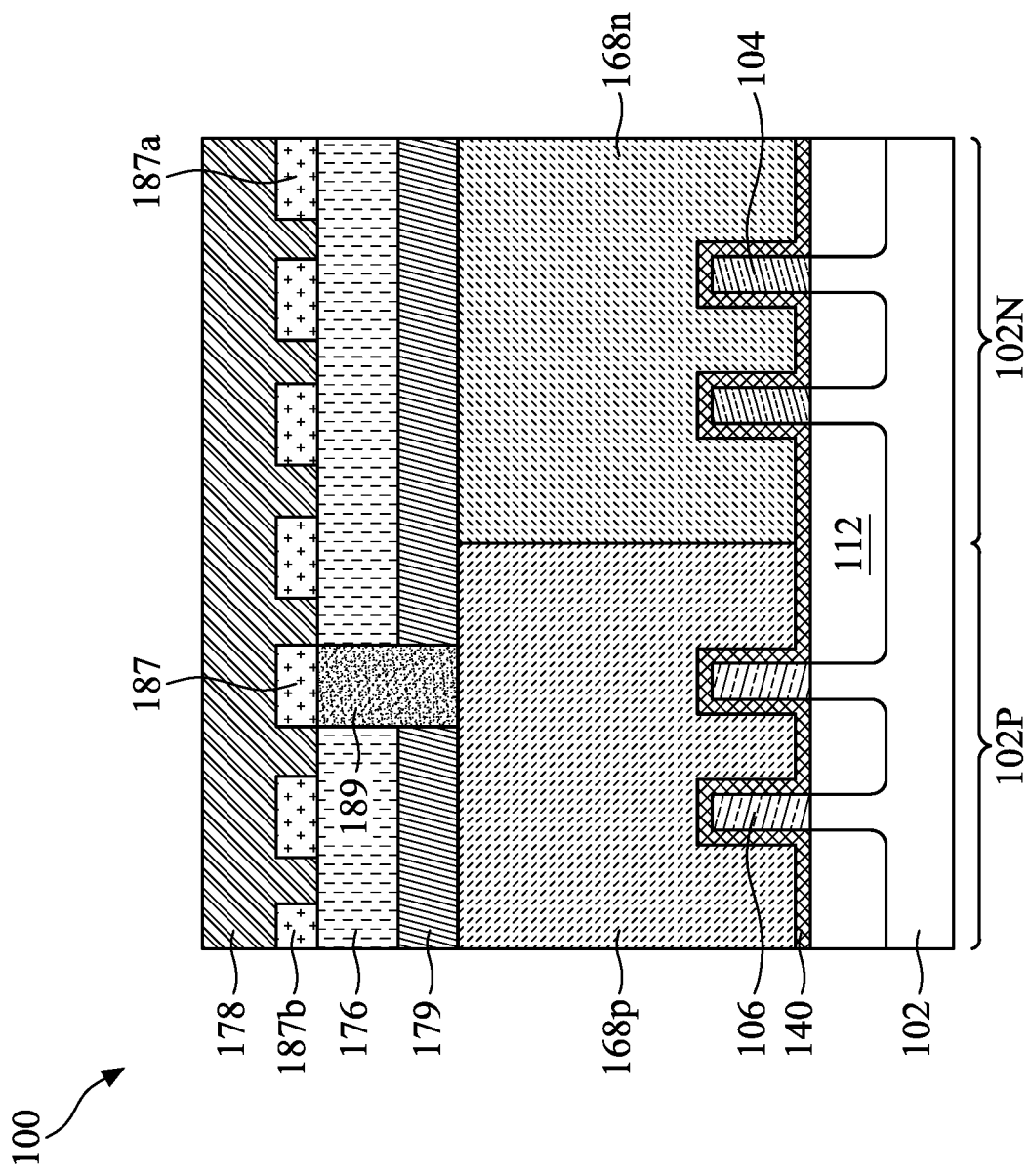
FIGS. 15E and 15F illustrate cross-sectional side views of various stages of manufacturing the semiconductor device structure of FIG. 4 taken along line E-E and line F-F, respectively, in accordance with some embodiments.
Figure 15F:
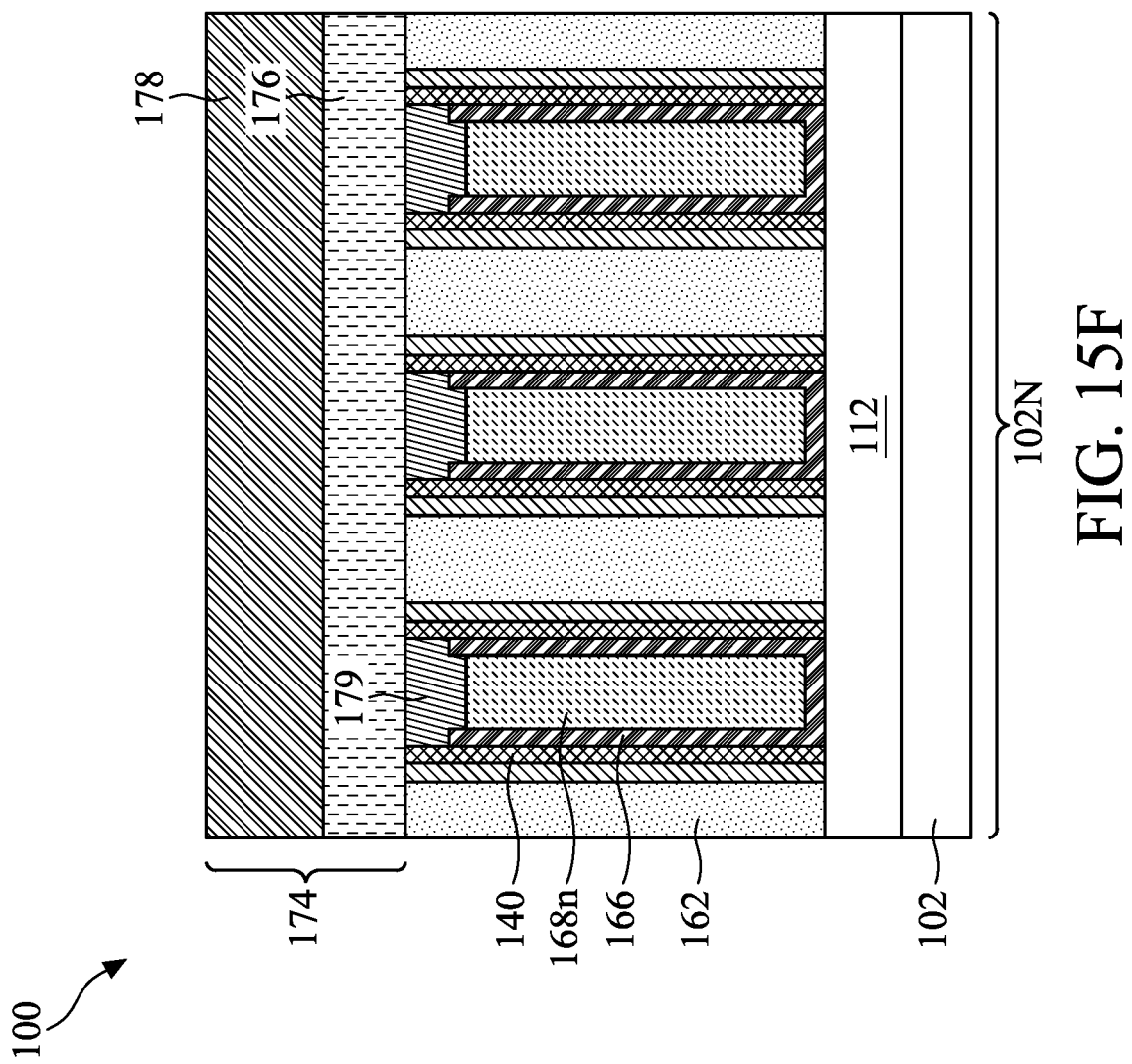

In FIGS. 15A-15D, an interconnect structure 174 is formed over the semiconductor device structure 100. The interconnect structure 174 may include one or more interlayer dielectrics and a plurality of interconnect features formed in each interlayer dielectric. In one exemplary embodiment shown in FIGS. 15A-15B, the interconnect structure 174 includes a second ILD layer 176 and a third ILD layer 178 formed over the second ILD layer 176, and a plurality of vertical interconnect features 185, such as vias, and horizontal interconnect features 187, such as metal lines, embedded in the second and third ILD layers 176, 178, respectively. FIGS. 15E and 15F illustrate cross-sectional side views of various stages of manufacturing the semiconductor device structure 100 of FIG. 4 taken along line E-E and line F-F, respectively, in accordance with some embodiments. Lines E-E and F-F correspond to lines E-E and F-F shown in a schematic layout 1600 of FIG. 16. The vertical interconnect features 185 are selectively formed to provide electrical connection to some of the S/D contacts (e.g., conductive feature 172). The horizontal interconnect features 187 are formed to selectively provide electrical connection between the S/D contacts in the N-type region 102N and the P-type region 102P. A conductive via 189 can be formed through the second ILD layer 176 and the SAC layer 179 to electrically connect the gate electrode layer (e.g., gate electrode layer 168p) to the horizontal interconnect features 187, as shown in FIG. 15C. The conductive via 189, the vertical interconnect features 185, and the horizontal interconnect features 187 may include or be formed of W, Ru, Co, Cu, Ti, TiN, Ta, TaN, Mo, Ni, or combinations thereof. The second and third ILD layer 176, 178 may be formed of the same material as the first ILD layer 162.

A power rail (not shown) may be formed in the third ILD layer 178 and configured to be in electrical connection with the S/D epitaxial features 152, 154 through the S/D contacts (e.g., conductive feature 172), the vertical interconnect feature 185, and the horizontal interconnect features 187. Depending on the application and/or conductivity type of the devices in the N-type region 102N and the P-type region 102P, the power rail may be fed with a positive voltage (VDD) or a negative voltage (VSS) (i.e., ground or zero voltage). For example, the VDD may be provided to the horizontal interconnect features 187a and the VSS may be provided to the horizontal interconnect features 187b, as shown in FIGS. 15A and 15E.

Figure 16:
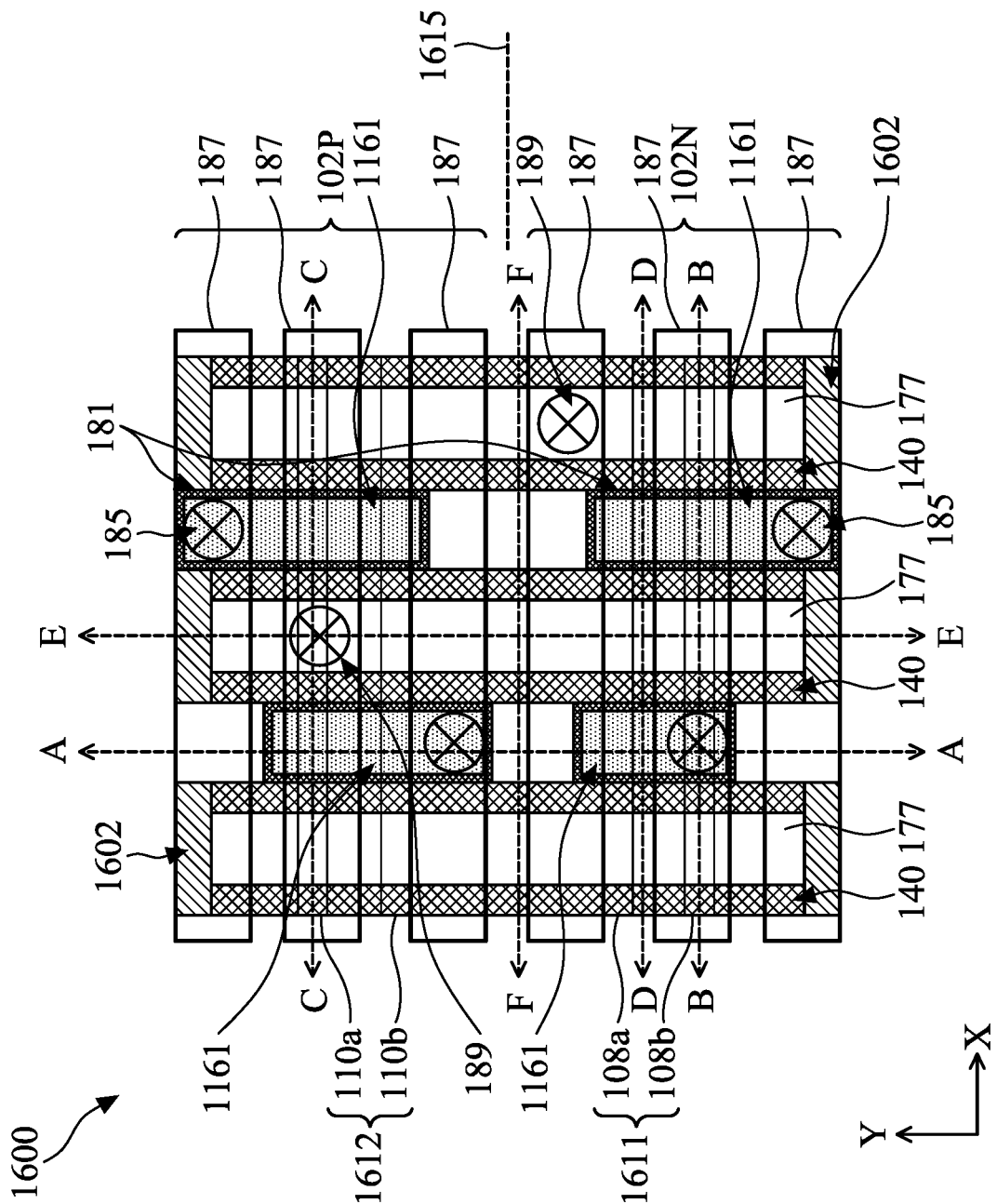
FIG. 16 is a top view of a schematic layout of the semiconductor device structure shown in FIGS. 15A-15F in accordance with some embodiments.

FIG. 16 is a top view of a schematic layout 1600 of the semiconductor device structure 100 shown in FIGS. 15A-15F in accordance with some embodiments. The layout 1600 includes the N-type region 102N and the P-type region 102P located on opposite side of an imaginary line 1615 which divides the semiconductor device structure 100 into separate regions for different types of devices or transistors. Active areas 1611, 1612, in which fins 108a-b and 110a-b are located, are disposed within the N-type region 102N and the P-type region 102P, respectively. The layout 1600 may represent a portion of the layout in a SRAM cell. For example, a 6T SRAM cell may include two pull-up (PU)

transistors, two pass-gate (PG) transistors, and two pull-down (PD) transistors. The fins 108a and/or 108b can be used to form PU transistors and the fins 110a and/or 110b can be used to form PD transistor or PG transistor in the 6T SRAM cell. The active areas 1611, 1612 extend along a first direction (e.g., the X direction) of the layout 1600. Replacement gate structures 177 extend from the N-type region 102N to the P-type region 102P along a second direction (e.g., the Y direction) of the layout 1600. Spacers 140 are arranged along longitudinal sides of the replacement gate structures 177 in the Y direction. A gate end dielectric 1602 are arranged along latitudinal sides of the replacement gate structures 177 in the X direction. The spacers 140 and the gate end dielectric 1602 are arranged for electrically isolating the replacement gate structures 177 from unintended electrical contact.

The layout 1600 also includes a plurality of contact areas 1161 in which S/D contacts (e.g., conductive feature 172) are located. Each of the contact areas 1161 is fully surrounded by the contact sidewall dielectric layer 181. A CESL (not shown) is disposed between and in contact with the contact sidewall dielectric layer 181 and the spacer 140. Vertical interconnect features 185, such as vias, are disposed at each contact area 1161. Horizontal interconnect features 187, such as metal lines, are arranged across the replacement gate structures 177 along the X direction. Vertical interconnect features 185 are disposed between and in contact with horizontal interconnect features 187. Conductive vias 189 are arranged between and in contact with the replacement gate structure 177 and the horizontal interconnect features 187.

The present disclosure provides an improved FinFET structure in which a recess is formed in a top portion of a fin (e.g., channel region) so that a first interface defined between a gate and the fin is at a level lower than a second interface defined between a gate spacer and the fin. The recess allows the fin to provide additional surface coverage (i.e., contact area) for subsequent gate electrode layer and therefore, a greater gate control at the top portion of the channel regions. In some embodiments, the second interface has a taper (sloped) profile having a first end towards the gate and a second end towards a source/drain (S/D) contact, and the first end is higher than the second end. In some embodiments, sidewalls of the S/D contact are fully surrounded by a dielectric layer, which isolates S/D contacts from nearby layers while preserving integrity of the S/D contacts.

An embodiment is a semiconductor device structure. The semiconductor device structure includes a first P-type metal oxide semiconductor field effect transistor (p-MOSFET) having a first fin extending along a first direction and comprising a first semiconductor layer, wherein the first fin comprises a first recess formed in a top of the first fin, the first recess having a bottom surface and a sidewall surface extending upwardly from the bottom surface. The semiconductor device structure also includes a first gate structure disposed in the recess and in contact with the bottom surface and the sidewall surface, the first gate structure extending along a second direction substantially perpendicular to the first direction. The semiconductor device structure further includes a first spacer disposed on opposite sidewalls of the first gate structure and in contact with the first fin and the first gate structure.

Another embodiment is a semiconductor device structure. The semiconductor device structure includes a first source/drain epitaxial feature disposed in an N-type region, a first conductive feature disposed over the first source/drain epitaxial feature, a first fin in contact with the first source/drain epitaxial feature, wherein the first fin comprises a first semiconductor layer, a contact etch stop layer (CESL) disposed adjacent the first conductive feature, a first gate dielectric layer in contact with the first fin, a first gate electrode layer disposed over the first gate dielectric layer, and a first spacer in contact with the first fin. The first spacer comprises a first portion disposed between and in contact with the CESL and the first gate dielectric layer, and a second portion disposed between and in contact with the first gate dielectric layer and the first source/drain epitaxial feature, wherein the second portion has a bottom at a level higher than a bottom of the first gate dielectric layer.

A further embodiment is a method. The method includes forming first and second semiconductor fins in an N-type region and third semiconductor fin in a P-type region, forming a sacrificial gate structure across the first, second, and third semiconductor fins, forming a spacer on opposite sidewalls of the sacrificial gate structure, recessing the first, second, and third semiconductor fins not covered by the sacrificial gate structure and the spacer, forming a first source/drain epitaxial feature on the recessed first and second semiconductor fins and a second source/drain epitaxial feature on the recessed third semiconductor fin, removing the sacrificial gate structure to expose the first, second, and third semiconductor fins, forming a recess in a top portion of the exposed first, second, and third semiconductor fins, and forming a replacement gate structure in the recess and over the exposed first, second, and third semiconductor fins, wherein a bottom of the replacement gate structure is at a level lower than a bottom of the spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
a first P-type metal oxide semiconductor field effect transistor (p-MOSFET) having a first fin extending along a first direction and comprising a first semiconductor layer, wherein the first fin comprises:
a first recess formed in a top of the first fin, the first recess having a bottom surface and a sidewall surface extending upwardly from the bottom surface;
a first gate structure disposed in the first recess and in contact with the bottom surface and the sidewall surface, the first gate structure extending along a second direction substantially perpendicular to the first direction, wherein the first pate structure and the bottom of the first recess define a first interface, and the first spacer and the first fin define a second interface;
a first spacer disposed on opposite sidewalls of the first gate structure and in contact with the first fin and the first gate structure:
a first source/drain epitaxial feature disposed in contact with the first semiconductor layer, wherein the first source/drain epitaxial feature has a top surface, and the second interface is at a level lower than the top surface of the first source/drain epitaxial feature.

2. The semiconductor device structure of claim 1, further comprising:
a first N-type metal oxide semiconductor field effect transistor (n-MOSFET) having a second fin extending along the first direction and comprising a second semiconductor layer, wherein the second fin comprises:
a second recess formed in a top of the second fin, the second recess having a bottom surface and a sidewall surface extending upwardly from the bottom surface;
a second gate structure disposed in the second recess and in contact with the bottom surface and the sidewall surface of the second recess, the second gate structure extending along the second direction; and
a second spacer disposed on opposite sidewalls of the second gate structure and in contact with the second fin and the second gate structure.

3. The semiconductor device structure of claim 2, wherein the second interface is at a level higher than the first interface.

4. The semiconductor device structure of claim 2, wherein the first semiconductor layer is SiGe and the second semiconductor layer is Si.

5. The semiconductor device structure of claim 1, further comprising:
a second P-type metal oxide semiconductor field effect transistor (p-MOSFET) having a third fin extending along the first direction and comprising a third semiconductor layer, wherein the third fin comprises:
a third recess formed in a top of the third fin, the third recess having a bottom surface and a sidewall surface extending upwardly from the bottom surface, wherein the first gate structure is disposed in the third recess and in contact with the first spacer, the bottom surface and the sidewall surface of the third recess.

6. The semiconductor device structure of claim 5, wherein the first semiconductor layer is SiGe and the third semiconductor layer is Si.

7. The semiconductor device structure of claim 5, wherein the first semiconductor layer is SiGe and the third semiconductor layer is SiGe.

8. The semiconductor device structure of claim 5, further comprising:
a first source/drain epitaxial feature disposed in contact with the first and third semiconductor layers;
a first conductive feature disposed over the first source/drain epitaxial feature; and
a contact sidewall dielectric layer surrounding the first conductive feature and in contact with an interlayer dielectric (ILD).

9. The semiconductor device structure of claim 8, wherein the first spacer and the third fin define a third interface, and the third interface has a slope with a highest point adjacent the third gate structure and a lowest point adjacent the first source/drain epitaxial feature.

10. A semiconductor device structure, comprising:
a first source/drain epitaxial feature disposed in an N-type region;
a first conductive feature disposed over the first source/drain epitaxial feature;
a first fin in contact with the first source/drain epitaxial feature, wherein the first fin comprises a first semiconductor layer;
a contact etch stop layer (CESL) disposed adjacent the first conductive feature;
a first gate dielectric layer in contact with the first fin;
a first gate electrode layer disposed over the first gate dielectric layer; and
a first spacer in contact with the first fin, the first spacer comprising:
a first portion disposed between and in contact with the CESL and the first gate dielectric layer; and
a second portion disposed between and in contact with the first gate dielectric layer and the first source/drain epitaxial feature, wherein the second portion has a bottom at a level higher than a bottom of the first gate dielectric layer, and the bottom of the second portion has a slope with a highest point adjacent the first gate dielectric layer and a lowest point away from the first gate dielectric layer.

11. The semiconductor device structure of claim 10, wherein the bottom of the second portion is higher than the bottom of the first gate dielectric layer by a height, and the height is in a range from about 1 nm to about 5 nm.

12. The semiconductor device structure of claim 10, further comprising:
a second source/drain epitaxial feature disposed in a P-type region;
a second conductive feature disposed over the second source/drain epitaxial feature;
a second fin in contact with the second source/drain epitaxial feature, wherein the second fin comprises a second semiconductor layer;
a second gate dielectric layer in contact with the second fin;
a second gate electrode layer disposed over the second gate dielectric layer; and
a second spacer in contact with the second fin, wherein the bottom of the second portion and the first fin define a first interface, and the second spacer and the second fin define a second interface, and each of the first and second interfaces has a slope.

13. The semiconductor device structure of claim 12, further comprising:
a first contact sidewall dielectric layer surrounding and in contact with the first conductive feature; and
a second contact sidewall dielectric layer surrounding and in contact with the second conductive feature.

14. The semiconductor device structure of claim 12, wherein the first and second contact sidewall dielectric layers are made of a material having a k value greater than 7.

15. The semiconductor device structure of claim 12, wherein the first and second contact sidewall dielectric layers each comprises $Si_3N_4$, SiON, SiCN, SiOCN, $AlSi_xO_y$, $Al_2O_3$, or any combination thereof.

16. The semiconductor device structure of claim 12, wherein the first semiconductor layer is SiGe and the second semiconductor layer is Si.

17. The semiconductor device structure of claim 12, wherein each of a top portion of the first fin and a top portion of the second fin has a substantially U-shaped.

18. A method for forming a semiconductor device structure, comprising:
forming first and second semiconductor fins in an N-type region and third semiconductor fin in a P-type region;
forming a sacrificial gate structure across a portion of the first, second, and third semiconductor fins;
forming a spacer on opposite sidewalls of the sacrificial gate structure;
recessing the first, second, and third semiconductor fins not covered by the sacrificial gate structure and the spacer such that a height of the first, second, and third semiconductor fins is gradually decreased along the direction away from the sacrificial gate structure;

forming a first source/drain epitaxial feature on the recessed first and second semiconductor fins and a second source/drain epitaxial feature on the recessed third semiconductor fin;

removing the sacrificial gate structure to expose the first, second, and third semiconductor fins;

forming a recess in a top portion of the exposed first, second, and third semiconductor fins, respectively, wherein each recess has a bottom surface and a sidewall surface extending upwardly from the bottom surface; and forming a replacement gate structure in each recess and in contact with the bottom surface, the sidewall surface, and the spacer, wherein a bottom of the replacement gate structure is at a level lower than a bottom of the spacer.

19. The method of claim 18, further comprising:

forming a contact etch stop layer (CESL) on the first and second source/drain epitaxial features;

forming an interlayer dielectric (ILD) on the CESL;

forming an opening through the ILD and the CESL to expose the first and second source/drain epitaxial features;

forming a contact sidewall dielectric layer on a sidewall of the opening; and forming a conductive feature over the first and second source/drain epitaxial features, wherein the contact sidewall dielectric layer fully surrounds and in contact with the conductive feature.

20. The method of claim 18, wherein the bottom of the spacer has a slope.

* * * * *